US012771027B1

(12) United States Patent
Anderson et al.

(10) Patent No.: US 12,771,027 B1
(45) Date of Patent: Oct. 20, 2026

(54) SHUNT-CONNECTED BEAMFORMER USING BALANCED-IMPEDANCE PHASE SHIFTER

(71) Applicant: Oso Semiconductor Inc., San Bruno, CA (US)

(72) Inventors: Matthew Anderson, San Bruno, CA (US); Greg LaCaille, San Bruno, CA (US)

(73) Assignee: Oso Semiconductor Inc., San Bruno, CA (US)

( * ) Notice: Subject to any disclaimer, the term of this patent is extended or adjusted under 35 U.S.C. 154(b) by 229 days.

(21) Appl. No.: 18/439,514

(22) Filed: Feb. 12, 2024

Related U.S. Application Data

(60) Provisional application No. 63/448,610, filed on Feb. 27, 2023.

(51) Int. Cl.
*H01Q 3/36* (2006.01)
*H03H 11/16* (2006.01)

(52) U.S. Cl.
CPC ............... *H01Q 3/36* (2013.01); *H03H 11/16* (2013.01)

(58) Field of Classification Search
CPC ................................ H01Q 3/36; H03H 11/16
See application file for complete search history.

(56) References Cited

U.S. PATENT DOCUMENTS

| | | | | |
|---|---|---|---|---|
| 6,611,230 | B2 * | 8/2003 | Phelan | H01P 1/181 342/373 |
| 10,777,890 | B2 | 9/2020 | Hallivuori | |
| 11,245,442 | B1 * | 2/2022 | Foo | H01Q 21/28 |
| 2002/0057219 | A1 | 5/2002 | Obayashi | |
| 2015/0070242 | A1 | 3/2015 | Kawai | |
| 2017/0012764 | A1 * | 1/2017 | Khlat | H04L 5/14 |
| 2018/0151953 | A1 | 5/2018 | Yoshida | |
| 2021/0296764 | A1 * | 9/2021 | Shams | G01S 13/931 |
| 2023/0033070 | A1 | 2/2023 | Vigano et al. | |

* cited by examiner

*Primary Examiner* — Vladimir Magloire
*Assistant Examiner* — Bongani Jabulani Mashele
(74) *Attorney, Agent, or Firm* — J. H. Lin Patent Law P.C.

(57) ABSTRACT

A balanced impedance phase shifter (BIPS) beamforming system with reduced the RF loss and power consumption is provided. The system includes multiple beamforming ports, multiple phase shifters, and a summing node at which the multiple phase shifters are connected in shunt. Each phase shifter includes a programmable impedance controlling phase shifting at a respective beamforming port of the phase shifter. The multiple phase shifters may be configured to steer a beam formed by the multiple beamforming ports in one or more dimensions. The programmable impedance comprises one or more digital tunable reactances or capacitors (DTCs), with each DTC connected in series with the beamforming ports and the summing node. Transformers and or inductors in series with the banks of DTCs are used for implementing the programmable impedance, providing common-mode isolation, and ESD protection.

20 Claims, 21 Drawing Sheets

SHUNT-CONNECTED BEAMFORMER USING BALANCED-IMPEDANCE PHASE SHIFTER

CROSS REFERENCE TO RELATED PATENT APPLICATION

The present disclosure is part of a non-provisional application that claims the priority benefit of U.S. Provisional Patent Application No. 63/448,610, filed on Feb. 27, 2023, titled "Shunt-connected beamformer using balanced-impedance phase shifter." Content of the above-listed application is herein incorporated by reference.

BACKGROUND

Technical Field

The present disclosure generally relates to radio-frequency (RF) beamforming technology.

Description of the Related Arts

Beamforming or spatial filtering is a signal processing technique used in sensor arrays and wireless communication for directional signal transmission or reception. This is achieved by combining elements in an antenna array in such a way that signals at specific angles experience constructive interference while others experience destructive interference. Beamforming can be used at both the transmitting and receiving ends in order to achieve spatial selectivity. The improvement compared with omnidirectional reception or transmission is known as the directivity of the array. Beamforming has numerous applications, including fifth generation (5G) broadband cellular networks.

SUMMARY

Some embodiments provide a balanced impedance phase shifter (BIPS) beamforming system with reduced RF loss and power consumption. The system includes multiple beamforming ports, multiple phase shifters, and a summing node at which the multiple phase shifters are connected in shunt. Each phase shifter includes a programmable impedance controlling phase shifting at a respective beamforming port of the phase shifter. The multiple phase shifters may be configured to steer a beam formed by the multiple beamforming ports in one or more dimensions. Each beamforming port may be attached to an antenna or other signal processing blocks as part of a phased array. The beamforming system may also be cascaded with another phased array to form a larger phased array.

The programmable impedance may include one or more inductors, one or more transformers, and one or more digital tunable capacitors (DTCs) or digitally tunable reactive elements, with each programmable impedance connected in series with the beamforming ports and the summing node. The programmable impedances may be arranged in two complementary banks for differential signaling. Coupled inductors in series with the banks of DTCs may be used for implementing the programmable impedance.

In some embodiments, the programmable impedance is digitally controlled to vary from $+jkR_S$ to $-jkR_S$, where $R_S$ is the beamformer port impedance and k is a scaling factor set by the desired scan angle. In some embodiments, each phase shifter further includes a crossover switch for configurably introducing a 180° phase shift at the respective beamforming port. In some embodiments, the programmable impedance includes first, second, third, and fourth banks of DTCs that are controlled by a crossover enable signal to configurably introduce a 180° phase shift and a programmable impedance, simultaneously. When the crossover enable signal is off, the first and fourth banks of DTCs are enabled to differentially connect to the summing node, and when the crossover enable signal is on, the second and third banks of DTCs are enabled to differentially connect to the summing node with the opposite polarity. The beamforming system may include a programming interface that provide control signals to control the programmable impedance, control the crossover switch of each phase shifter, and store or load preset configurations. In some embodiments, the programmable impedance and the crossover switches of the plurality of phase shifters are controlled to implement a balanced impedance tuning (BIT) algorithm.

In some embodiments, each phase shifter also includes a matching network that is configured to condition a common mode impedance at the summing node, and to ensure that a common mode impedance at the summing node is independent of an impedance at the respective beamforming port. The matching network may also be configured to condition a differential port impedance at a beamforming port to a specific value. The matching network may include a shunt inductor that can be used to provide electrostatic discharge (ESD) protection. The matching network may also include an isolating transformer or balun unit. The balun unit may provide single-ended to differential conversion between the respective beamforming port and the summing node and ESD protection. The differential impedance of this matching network (e.g., the leakage inductance of the transformer or balun unit if one is used for the matching network) may be used to implement the programmable impedance. Thus, the matching network or the transformer may be used for single-ended to differential conversion, ESD protection, providing a fixed reactance to resonate with the programmable reactance elements to achieve the full range of programmable impedances desired, and providing optimal common-mode impedance at the summing node.

The preceding Summary is intended to serve as a brief introduction to some embodiments of the disclosure. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a Summary, Detailed Description and the Drawings are provided. Moreover, the claimed subject matter is not to be limited by the illustrative details in the Summary, Detailed Description, and the Drawings, but rather is to be defined by the appended claims, because the claimed subject matter can be embodied in other specific forms without departing from the spirit of the subject matter.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

Phased arrays or electrically steerable antennas (ESAs) are a key enabling technology for many modern wireless networks and sensors. Example applications of phased arrays include high-performance radars for planes, cars, and drones to provide single degree spatial resolution imaging. ESAs enable highly focused transmit power for satellites and 5G base stations to increase range and energy efficiency. They allow for near instantaneous digital steering of wireless beams to track fast moving objects, like planes and trains. They may also have Internet-of-Things (IoT) applications for providing low-power spatially selective tags.

A phased array includes multiple antenna elements (sometimes thousands) arranged in regular patterns. These individual antenna elements work together to receive or transmit signals with a fixed phase relationship, creating radiation patterns with regions of constructive (or high gain) and destructive (or low gain) interference. The antenna elements in the phased array can form narrow, high-gain wireless beams. These wireless beams can be programmed electronically to track moving objects or hone-in on small signals in noisy environments. This operation of precise phase shifting and summation to form the wireless beams is referred to as beamforming. The more antenna elements that are beamformed for the array, the higher the gain and the narrower the beam, which translate to greater range and spatial selectivity.

Figure 1:
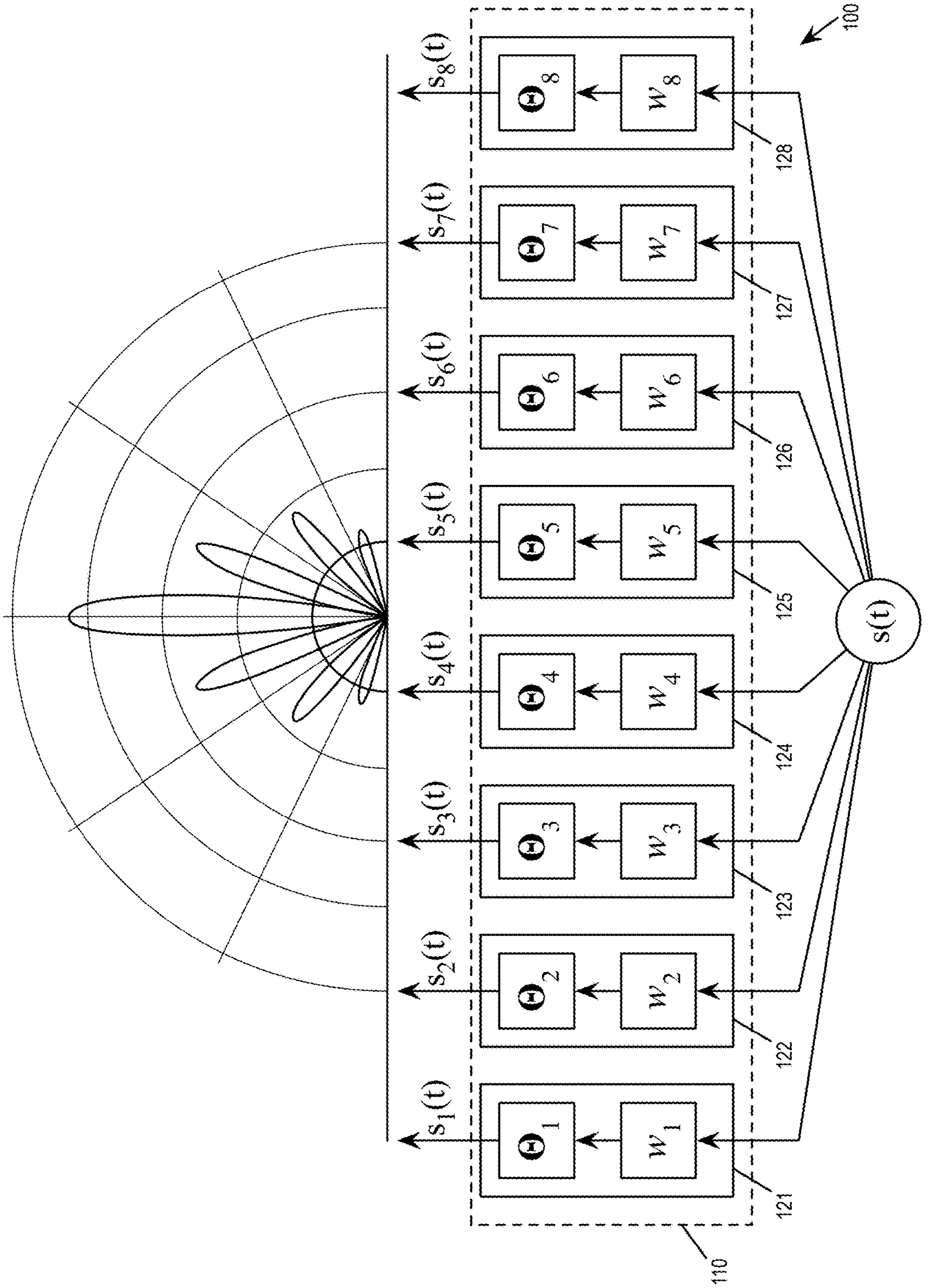
FIG. 1 conceptually illustrates an example beamformer performing beamforming operation.

FIG. 1 conceptually illustrates an example beamformer 100 performing beamforming operation. The example beamformer 100 includes an array 110 that includes at least eight beamforming elements 121-128. The beamformer 110 may be part of a phased array in which each beamforming element is attached to an antenna element. Each beamforming element includes a phase controller (Θ) an optional gain controller (w). Based on a source signal s(t), the beamformer 110 generate a beam pattern by the sum of the signals from the antennas attached to the beamforming elements. The phase controllers in the array 110 control the phase delays of the signals $s_1(t)$ through $s_8(t)$ from the different beamforming elements in order to create the intended beam pattern.

Figure 2:
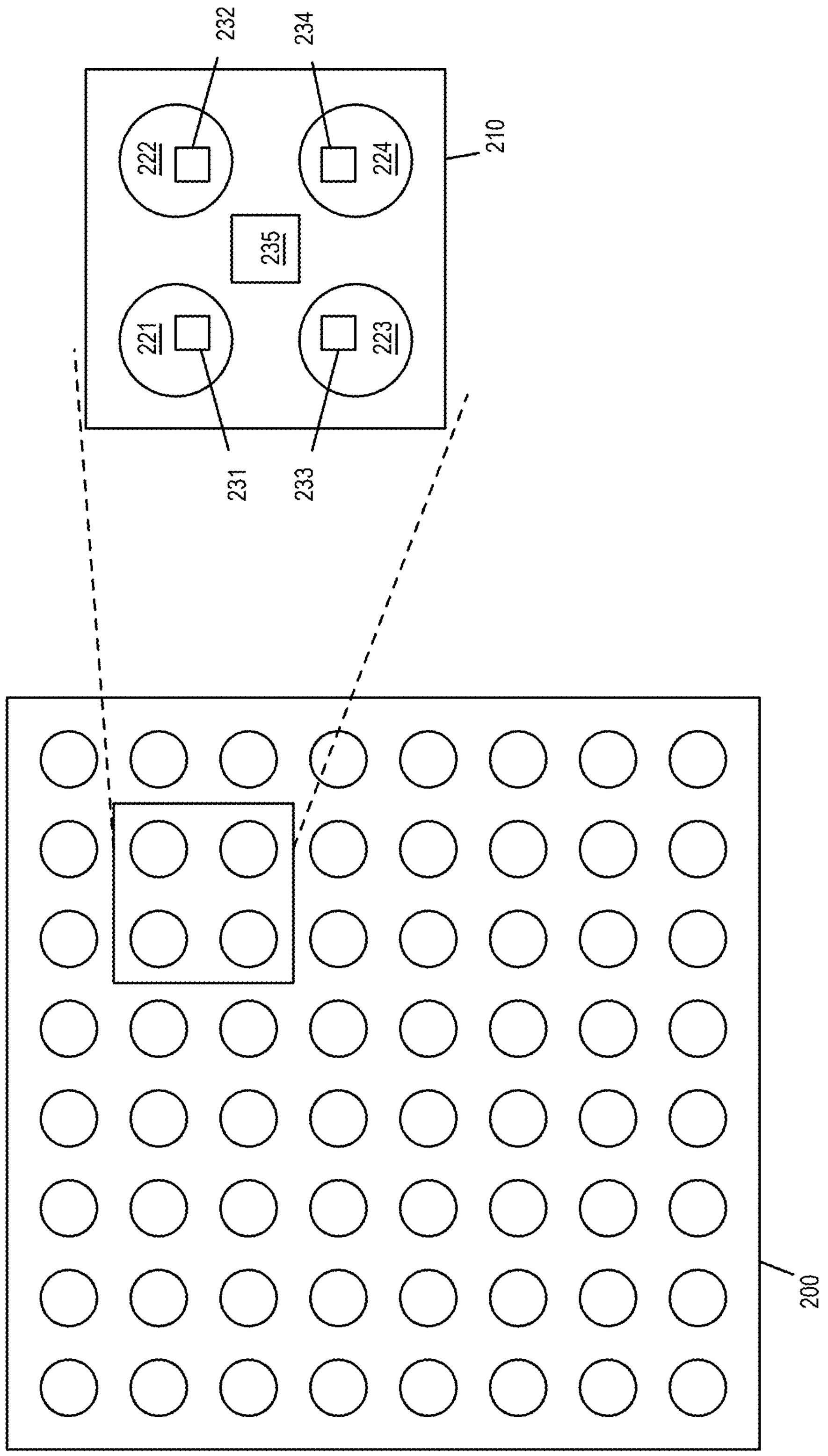
FIG. 2 illustrates an electronic device implementing a two-dimensional phased array.

FIG. 2 illustrates an electronic device 200 implementing a two-dimensional phased array. The two-dimensional phased array includes 64 antennas (or radiating elements). The two-dimension phased array is implemented by an arrangement of 2-by-2 unit cells. Each unit cell 210 is an electronic circuit (e.g., a printed circuit board) that implement four antennas 221-224. Each unit cell includes one or more RF ICs 231-235 that perform phase control, optional gain control, and signal summation required for beamforming. In other words, each unit cell implements the corresponding beamforming elements for the antenna elements.

Implementing phase arrays in modern wireless networks pose certain power challenges. These phase array systems require many antenna elements, each with their own power-hungry RF signal chains and signal processing. The result being a significant increase in RF power consumption for phased array beamforming systems over omni-directional wireless systems. The fact that these phase array systems usually operate at significantly higher frequencies, where silicon transistors are less efficient and per-antenna apertures are smaller, only makes the power problem worse. Even in modestly sized arrays, the added power consumption can be problematic for both battery-life and thermal management.

The key drivers for the high-power consumption in the beamforming systems are the electronic components used, particularly the RF frontend amplifiers such as the low-power amplifiers (LNAs), power amplifiers (PAs), and beamformers. The RF amplifiers in these frontend components are quite power-intensive as these systems often include many stages of RF amplification. The RF amplification are employed to compensate for the lossy beamformers, which perform high frequency phase shifting and summation required to steer the array's beam.

Due to massively duplicated elements in phase arrays, the complexity, cost, and power consumptions of individual components are significant issues for a beamforming system. Simplifications that reduce the complexity or size of each component part, such as the beamformer, have a significant impact on reducing overall phase array complexity, cost, and power consumptions. Techniques that reduce beamformer RF losses will also have a huge impact on overall system power consumption and performance because they reduce the amount of power-hungry RF amplifiers in the system.

RF beamformers may use a combination of Wilkinson combiners and vector modulators for signal summation or power combining and switch-type passive phase shifters for phase shifting. Such RF beamformers may use RF amplifiers to compensate for lossy passive phase shifters and power combiners, or use active RF vector modulators with built-in gain. In both cases, the active RF components consume significant amounts of power in order to generate low-noise, low-distortion gain at these high (RF) frequencies.

Series-connected balanced-impedance phase shifter (BIPS) beamformers use transmission-line transformers (TLTs) incorporated into the feed lines and balanced impedance phase shifters (BIPSs) to construct an RF beamforming phased array. Utilizing TLTs built into the feed structure for series signal combining eliminates the need for additional lossy RF power combining structures, while the use of balanced impedance tuning (BIT) algorithms with BIPSs reduces the loss and complexity associated with phase shifting. Altogether this allows for the realization of a low power and low loss RF beamformer with good bandwidth.

Figure 3B:
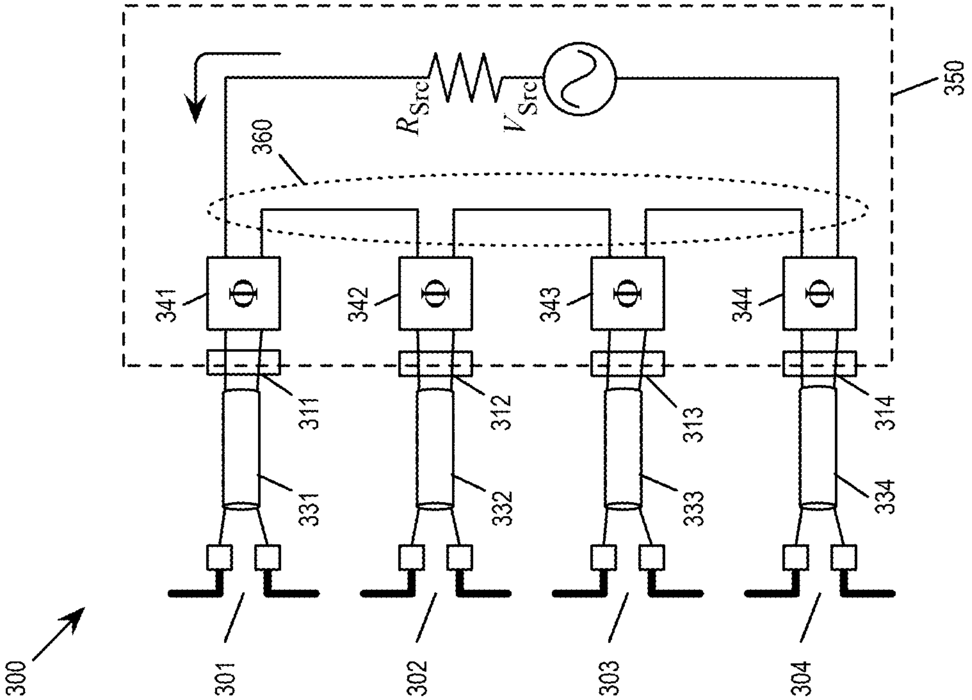
FIGS. 3A-B illustrate a series-connected balanced impedance phase shifter (BIPS) beamformer that is used to implement a phased array.
Figure 3A:
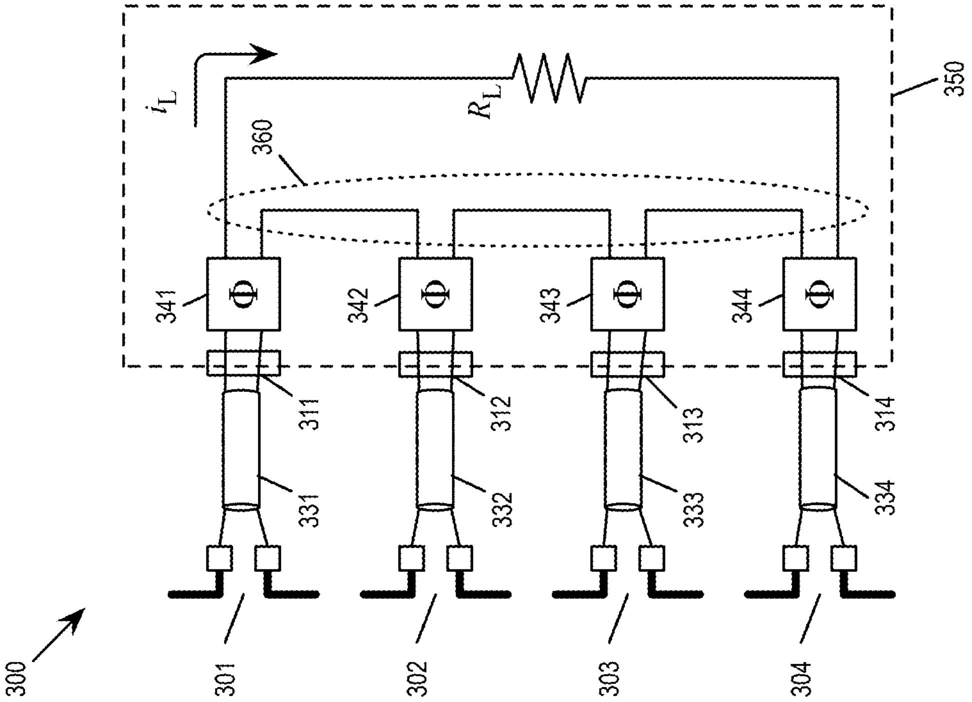

FIGS. 3A-B illustrate a series-connected BIPS beamformer 300 that is used to implement a phased array. The BIPS beamformer 300 is implemented by an RF IC 350. RF feedlines, which may be used to implement TLTs to reduce common-mode loss, 331-334 connect four antennas 301-304 to the RF IC 350 at four beamforming ports 311-314. The RF IC 350 implements four balanced impedance phase shifters (BIPS) 341-344 to phase shift the signals of the four beamforming ports 311-314. In some embodiments, the four beamforming ports 311-314, the BIPS 341-344, and the RF feedlines 331-334 may be entirely or partially implemented by the RF IC 350. FIG. 3A shows the beamformer 300 operating in a receive mode. FIG. 3B shows the beamformer operating in a transmit mode.

The phase shifting elements (BIPS) 341-344 of the beamforming ports 311-314 are connected in series in the IC 350 with a load impedance ($R_L$) or a power source ($R_{Src}+V_{Src}$). A node 360 at which the four phase shifting elements are connected in series is referred to as the summing node of the beamformer 300. The load impedance $R_L$ or source impedance $R_{Src}$ at the summing node 360 is designed to ensure optimal power transfer from the antennas to the IC 350 over all available beam angles 350. The RF feed lines 331-334 are designed to also function as transmission line transformers (TLTs), transforming the effective common-mode impedance seen at the input of the IC 350 to a large real value in order to facilitate low-loss and wide bandwidth series combining without affecting the differential-mode impedance.

For some embodiments, a high common-mode impedance is used at the summing node of the beamformer for low-loss summation via series combining. A large complex network may be used to optimize the common-mode impedance. In some embodiments, transmission-line transformers (TLTs) are used to implement the common-mode impedance at the summing node. In some embodiments a specialized matching network (MN) can be used to provide common-mode impedance conditioning to minimize the losses at the summing node. In some embodiments, both TLTs and MN may be used.

Figure 4:
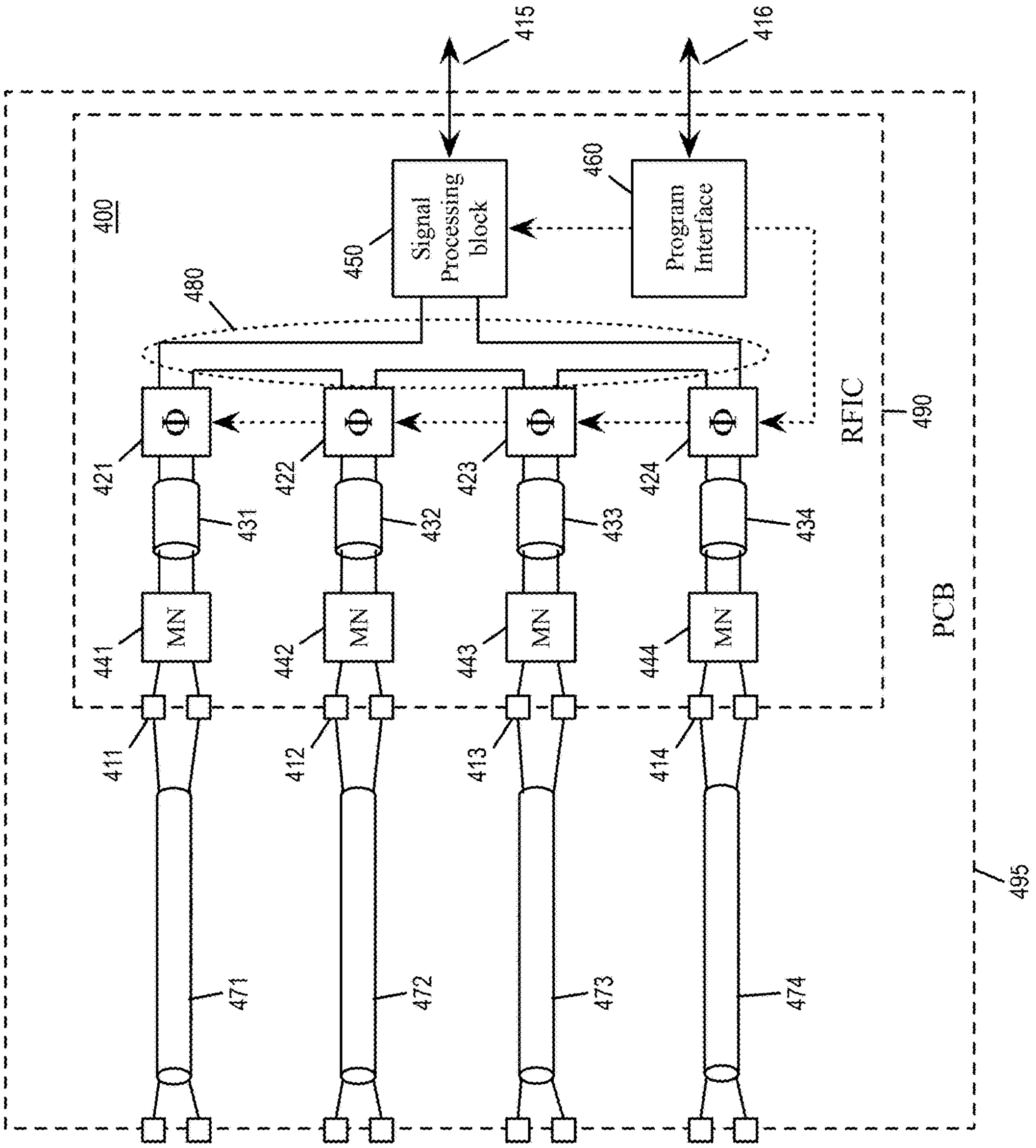
FIG. 4 shows a series-connected BIPS beamformer having optimized common-mode impedance at the summing node.

FIG. 4 conceptually illustrates a BIPS beamformer 400 having optimized common-mode impedance at the summing node by incorporating transmission-line transformers (TLTs) and matching networks (MN). The example BIPS beamformer 400 is a four-element BIPS beamformer with four beamforming ports 411-414. The four beamforming ports 411-414 may drive or receive from four antenna elements through four RF feedlines 471-474, which are used as TLTs. The beamformer 400 includes corresponding BIPSs 421-424, MNs 441-444, and TLTs 471-474. The BIPSs 421-424 are used as phase shifters or delay blocks for four beamforming elements.

In receive mode, signal flow from the antenna elements into the four beamforming elements of the beamformer 400 through the beamforming ports 411-414. The powers of the four beamforming elements are combined at the summing node 480. The combined power is feed to a signal processing block 450 for amplification or filtering as needed by the array. A programming interface 460 provide control bits to the BIPS cell units/phase shifters 421-424. The signal processing block 450 may be an amplifier, transformer, mixer, digital converter, or other common circuit block. The signal processing block 450 may also be absent in some embodiments. Ports 415 and 416 serve as signal/control connections to the signal processing block 450 and the programming interface 460, respectively. In transmit mode, the signal flow is reversed, such that signal is sourced by the signal processing block 450 or Port 415, then flows to the summing node 480, and then flows through the four beamforming elements of the beamformer 400 toward beamforming ports 411-414 and to the antenna elements.

In this implementation, the BIPSs 421-424 and the MNs 441-444 (with the RF routing 431-434) are placed on a RF integrated circuit (RFIC) 490. The TLTs 471-474 are designed on a printed circuit board (PCB) 495 that carries the RFIC 490. The TLTs 471-474, the BIPSs 421-424, and the MNs 431-434 all contribute to the overall loss, area, and complexity of the beamformer 400.

Figure 5:
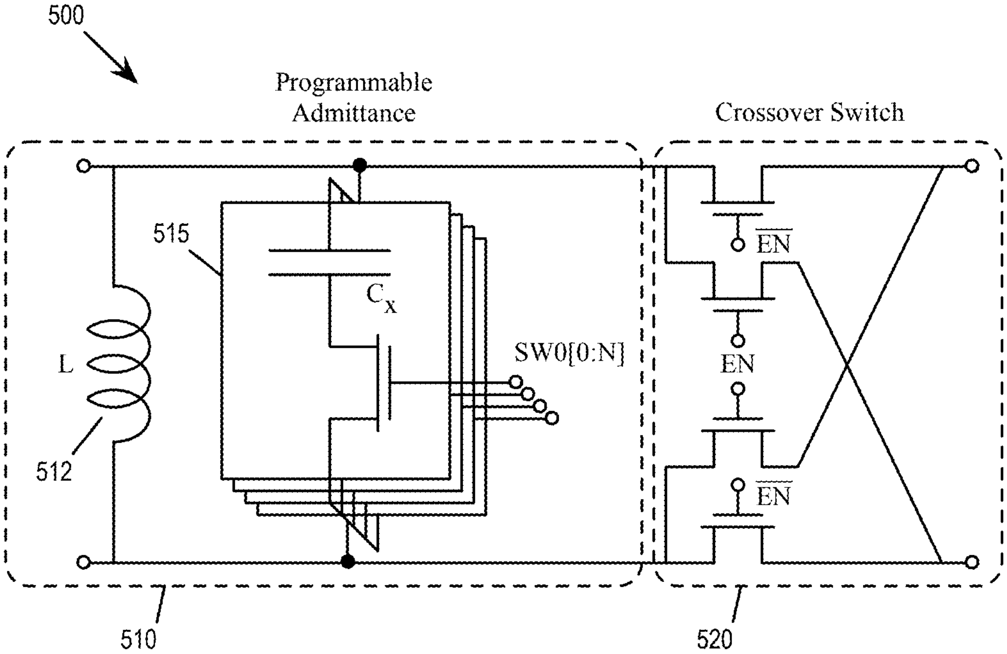
FIG. 5 conceptually illustrates an example BIPS cell unit for a series-connected BIPS beamformer.

FIG. 5 conceptually illustrates an example BIPS cell unit 500. As illustrated, the BIPS cell unit 500 (or delay block or phase shifter) has a programmable admittance 510 and a crossover switch 520. The BIPS cell unit 500 can be used as any of the BIPS cell units 421-424. The digitally controlled programmable admittance 510 varies from $+jk/R_S$ to $-jk/R_S$, where $R_S$ is the beamformer port impedance, k is a scaling factor set by the desired scan angle loss (nominally, $k \approx 1$), and j indicates imaginary domain. Increasing k results in lower theoretical losses across scan angle but makes practical realization of the programmable admittance more challenging and more lossy. The crossover switch 520 is also digitally controlled and can be activated or deactivated to impart a 180° or 0° phase shift on the signals passing through the BIPS.

In the BIPS, the programmable admittance 510 may be implemented using a shunt connected fixed inductor 512 and digitally tunable capacitor (DTC) 515 or other digitally tunable reactive elements, while the crossover switch 520 may be implemented using four transistor switches in a butterfly or crossover configuration.

A linear 1-dimensional phased arrays such as the BIPS beamformer 400 is inherently symmetrical in that the desired phase shift on port 1 (or 2) is the negative of the desired phase shift on port 4 (or 3). A BIT algorithm controlling a BIPS may take advantage of this symmetry such that the number of switchable or tunable components and the number of lossy passives in the BIPS can be significantly reduced (when compared to e.g., conventional switch-type passive phase shifters.) This ultimately reduces phase shifter loss. This approach reduces the complexity of the phase shifters because in the BIPS 400, the reactance added in shunt across one port (e.g., the admittance 510 of a BIPS unit cell 500) to impart a phase shift, Y, is canceled by the negative reactance added in shunt across another port to impart the opposite phase shift, −Y. This eliminates the need for additional lossy components in the phase shifters to maintain a relatively constant input and output impedance (e.g., 50 Ohms) across a range of phase shifts.

A balanced impedance tuning (BIT) algorithm may be utilized in conjunction with the BIPS beamformer 400 to enable low-loss phase shifting and beamforming. The algorithm leverages symmetry of the array to simplify the phase shifter circuitry required and reduce sources of loss. The algorithm is applicable to both transmit and receive operations of the BIPS beamformer 400.

For some embodiments, a high common-mode impedance is used at the summing node of the beamformer for low-loss summation via series combining. A large complex network may be used for optimizing the common-mode impedance. In some embodiments, transmission-line transformers (TLTs) are used to implement the common-mode impedance at the summing node. In some embodiments a specialized matching network (MN) can be used for common-mode impedance conditioning to minimize the losses at the summing node.

Figure 6:
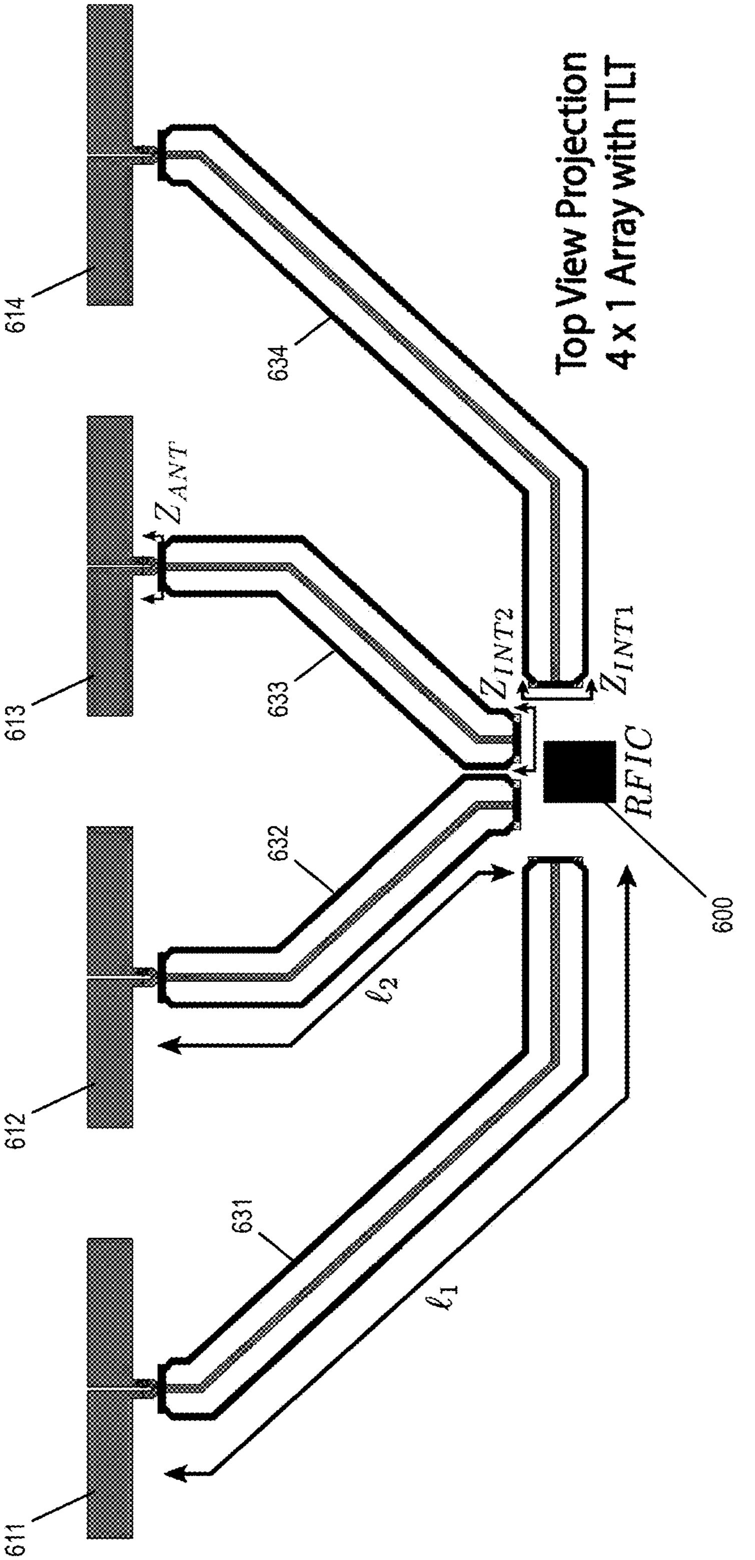
FIG. 6 illustrates routing of transmission-line transformers from an antenna array to a radio frequency integrated circuit (RFIC).

In the example of FIG. 4, the BIPS beamformer 400 includes the TLTs 471-474 and the MNs 441-444 for implementing the common-mode impedance and for providing the common-mode impedance conditioning at the summing node 480. FIG. 6 illustrates routing of transmission-line transformers (TLTs) 631-634 from an antenna array (antenna elements) 611-614 to a RFIC 600 implementing the BIPS beamformer.

The TLTs shown in FIG. 6 utilizes transmission lines with a high characteristic common-mode impedance $Z^{CM}_{O}$, and an optimized length l, to transform the port's common-mode impedance (e.g., the antenna's common-mode impedance $Z_{ANT}$) to a large real value (of common-mode impedance at the interface of the RFIC 600 $Z_{INT}$) for low-loss series combining. Broadside coupled transmission lines may be chosen because of their large characteristic common-mode impedance $Z^{CM}_{O}$. The length of the transmission lines (value of l) can be determined using electromagnetic simulation.

While the BIPS RF beamformers are low loss passive beamformers relative to state of the art, they still suffer very high RF losses. This results in either reduced performance or higher power consumption for phased arrays utilizing BIPS RF beamformers. The primary loss sources are the matching network (MN) and transmission-line transformers (TLTs) which are required to condition the common-mode impedance from the beamforming ports. The MN requires many passive components, including inductors and capacitors, all of which add loss and limit the common-mode impedance realized at the summing node. Although, the TLTs help to maximize the common-mode impedance at the summing node, they are ultimately limited by their own characteristic common-mode impedance.

The TLTs may also have an impact on size and complexity of the beamformer system. The TLT network may add significant size and complexity to the beamformer. The large cross-sectional area of the RF feed lines in the TLTs make it difficult to route the signals from the beamforming ports to the beamformer circuit. Requirements for precise control of TLT dimensions, including trace spacing and dielectric height, introduce significant constraints on the design of printed circuit boards (PCBs) and other design mediums. Furthermore, the length and $Z^{CM}_{O}$ of the TLT has to be optimized based on the antenna's properties (or what was connected to the beamforming port). This makes it impractical for commercial systems where antenna's properties (or what was connected to the beamforming port) vary widely from use case to use case.

Some embodiments provide a shunt-connected BIPS beamformer. In the shunt-connected BIPS beamformer, the multiple beamforming ports are connected in shunt or parallel. A programmable impedance (or digitally tunable impedance, DTZ) is connected in series across each of the multiple beamforming ports as a balanced impedance phase shifter (BIPS). Generally, the shunt-connected BIPS beamformer may have N beamformer ports, with N phase shifters, with N=2, 3, 4, . . . , where N=number of inputs/outputs or antennas. The multiple phase shifters (or their DTZs) may be configured to steer a beam formed by the multiple beamforming ports in one or more dimensions.

Figure 7A:
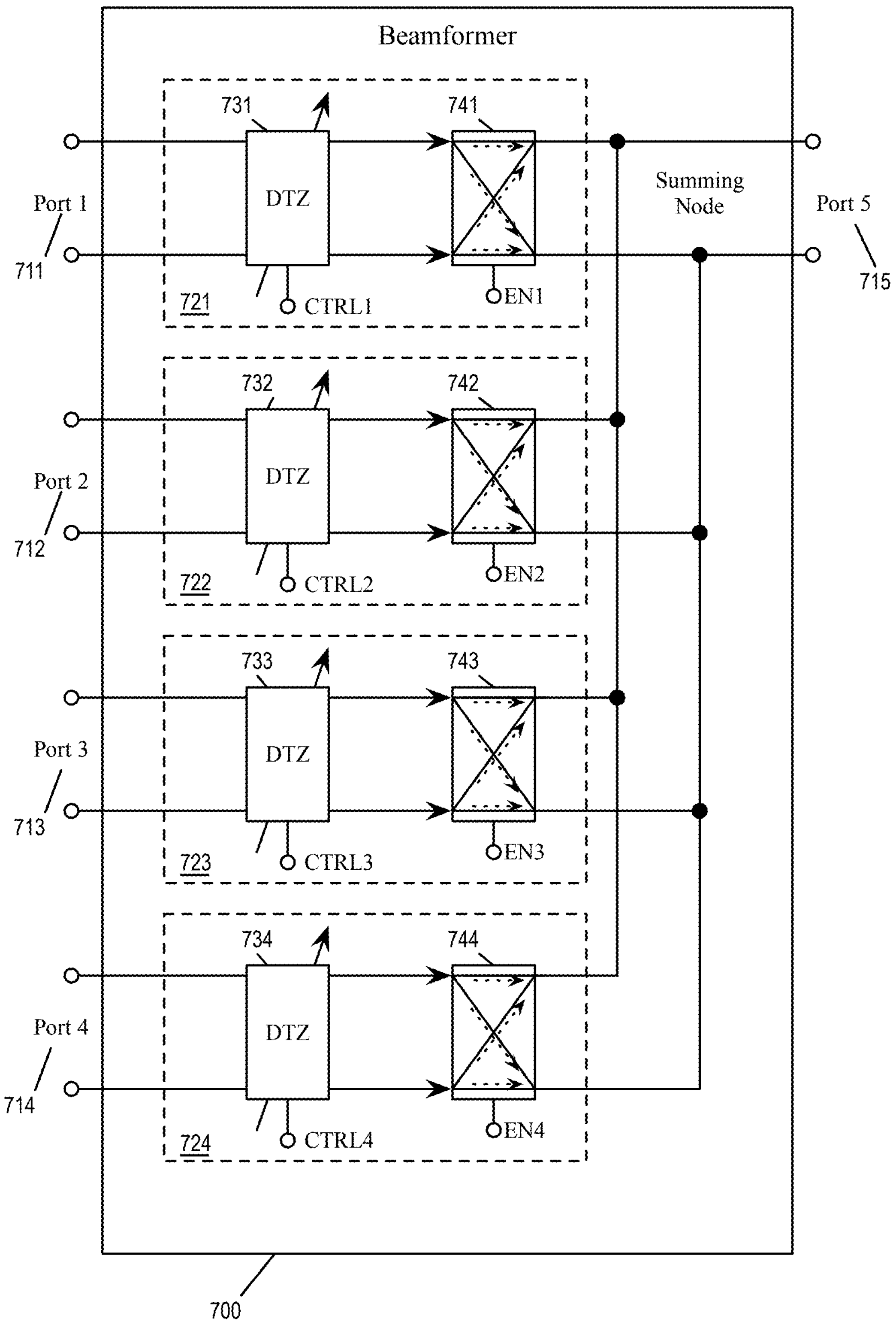
FIGS. 7A-B show an example circuit of a shunt-connected BIPS beamformer.
Figure 7B:
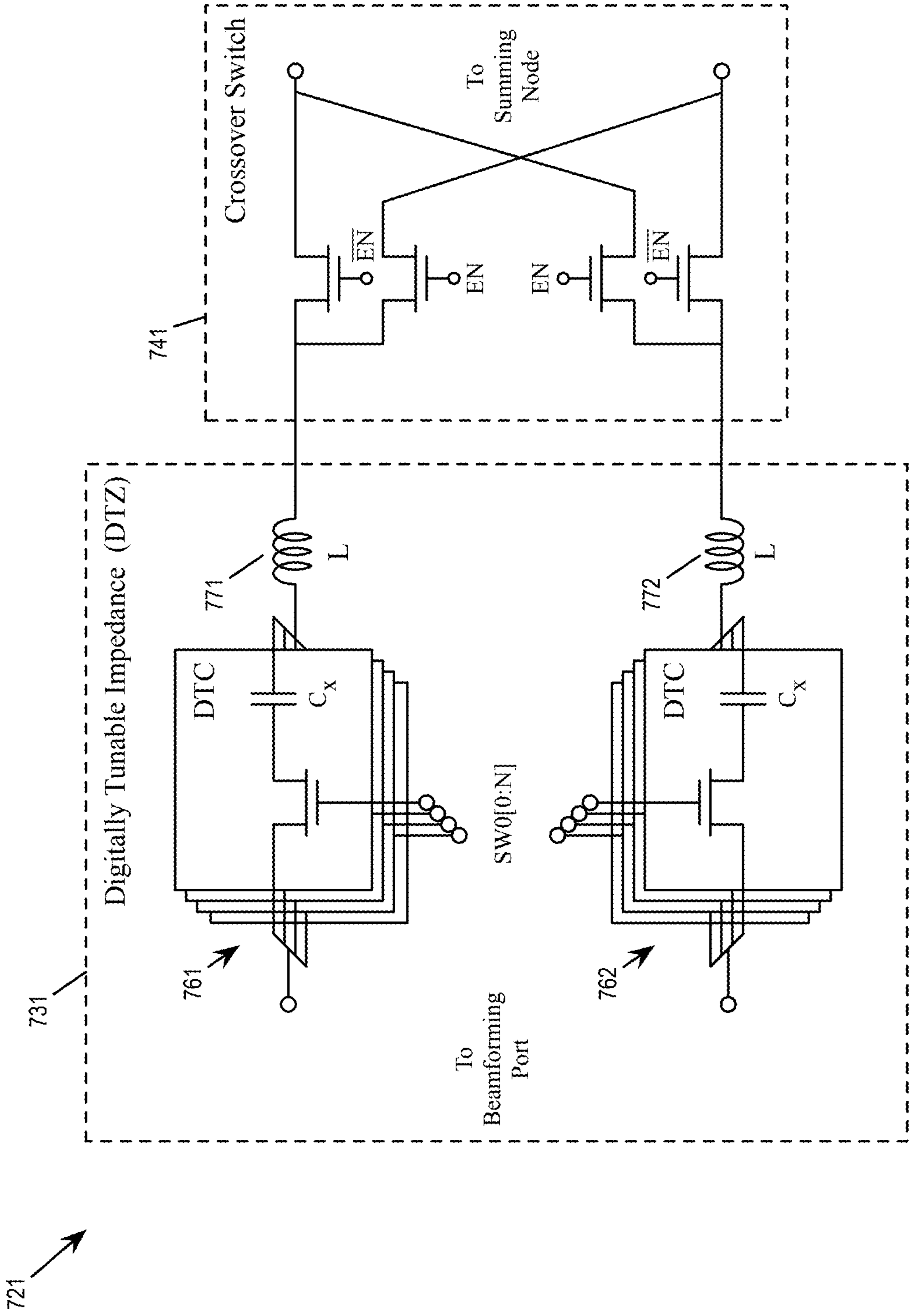

FIGS. 7A-B show an example circuit of a shunt-connected BIPS beamformer. FIG. 7A illustrates the shunt-connected BIPS beamformer circuit 700 having four balanced impedance phase shifters (BIPS) 721-724 to phase shift the signals of the four beamforming ports 711-714 (ports 1-4). The beamforming ports 711-714 may also be buffered or not. They may terminate into the antennas or some other signal processing block.

The four phase shifters (or BIPS unit cells) 721-724 are connected in shunt at summing node 750, which is accessible by a fifth port 715 (port 5) of the circuit 700. The summing node 750 of the shunt-connected BIPS beamformer is also referred to as the shunt connection point.

The phase shifter of each beamforming port includes a digitally tunable impedance (DTZ) and a crossover switch. In the example, the phase shifters 721-724 includes DTZs 731-734 and crossover switches 741-744. The DTZs 731-734 are respectively controlled by control signals CTRL1-CTRL4, while the crossover switches 741-744 are respectively enabled by enable signals EN1-EN4.

FIG. 7B illustrates one of the phase shifters, or a BIPS unit cell, in greater detail. As illustrated, the phase shifter 721 includes the DTZ 731 and the crossover switch 741. The DTZ 731 includes two complementary banks of programmable capacitors 761 and 762 for differential signaling. Each programmable capacitor may be a digital tunable capacitor (DTC). The DTCs of each bank are connected together in shunt, while each DTC is connected in series with the beamforming port and the summing node. Though not illustrated, in some embodiments, the DTZs 731-734 may also be implemented by using programmable inductors or other programable reactances.

The two banks of DTCs 761 and 762 are controlled by a set of switch signals SW0[0:N]. The switch signals can configure the two banks of DTCs to present a specific impedance value of the DTZ 731. Connected in series with the DTC banks 761 and 762 are fixed inductors 771 and 772, which are in turn connected to the differential inputs of the crossover switch 741. The crossover switch is in turn connected to summing node or port 5. The DTCs may be implemented using any tunable elements, including capacitive DACs, varactors, active devices, etc. The circuits may also feature balanced or unbalanced topologies.

The beamforming in the shunt-connected BIPS beamformer may be performed by a shunt-based balanced impedance tuning (BIT) algorithm, in which the impedances (instead of admittances) are tuned in a balanced way to provide relative phase shifts of 90° or less and crossover switches provide 0° and 180° phase shift. Due to the symmetry inherent in any planar array, the relative phase shifts between the beamforming ports can be set to be balanced. This balance in relative phase shift can be leveraged by the shunt-based BIT algorithm.

It can be shown that through the balanced tuning of the DTZs in the shunt-connected beamformer, a phase shift can be produced from beamforming port i (1 through 4) to port 5 (and vice-versa) that is proportional to the angle of $(R_S+Z^i_{DTZ})$ were $R_S$ is the i-th beamforming port impedance and $Z^i_{DTZ}$ is the impedance of the DTZ on the i-th beamforming port. Correspondingly, a small imaginary $Z^i_{DTZ}$ relative to $R_S$ produces a negligible phase shift, and a positive or negative imaginary $Z^i$ equaling to $R_S$ produces a nearly +45° or −45° phase shift. In this way, the phase shift can be controlled from each of the beamforming ports relative to port 5 to ensure constructive interference in the direction of interest and destructive interference in other directions (i.e., beamforming).

In the shunt-based BIT algorithm, the DTZs are sized to vary from $+jkR_S$ to $-jkR_S$, where $R_S$ is the beamformer port impedance and k is a scaling factor set by the desired scan angle loss (nominally, $k \approx 1$). Increasing k may result in lower theoretical losses across scan angle but makes practical realization of the DTZ more challenging and more lossy. Implementations of the DTZ may feature an inductor, L, and a digitally tunable capacitor (DTC). The values of L, $C_{DTC}$, $C^{max}_{DTC}$, and $C^{min}_{DTC}$ are sized such that $Z_{DTZ}$ ranges from $+jkR_S$ to $-jkR_S$ over the frequencies of interest ($C^{max}_{DTC}$ and $C^{min}_{DTC}$ are the maximum and minimum achievable capacitances for the DTC. Other programable reactances, such as varactors, may used to realize the DTZ.

In some embodiments, the shunt-based BIT algorithm has the following features: First, with $Z_{DTZ}$ set to zero at all ports, the crossover switches (e.g., the switches 741-744 in the phase shifters 721-724) are configured to reduce the maximum phase delay between all ports. Second, the change in impedance across the phase shifter 721 for port 1, $\Delta Z_1$, is set to be equal to the negative of the change in impedance across the phase shifter 724 for port 4, $-\Delta Z_4$. Third, the change in impedance across the phase shifter for port 2, $\Delta Z_2$, is set to be equal to the negative of the change in impedance across the phase shifter for port 3, $-\Delta Z_3$. Fourth, the value of $\Delta Z_1$ and $\Delta Z_2$ are swept to maximize the power delivered to the load for a given angle of arrival, θ. This process may consider finite quantization increments in the programmable Z (impedance) values, relative phase delays in the ports due to differing feed lengths, limits in the absolute range of Z values, and power loss due to impedance mismatch with the load for larger absolute values of Z. The algorithm and hardware described so far also works for transmit, where power is flowing from a source to the beamforming ports with varying phase delays to maximize the power delivered for a given θ.

Figure 8A:
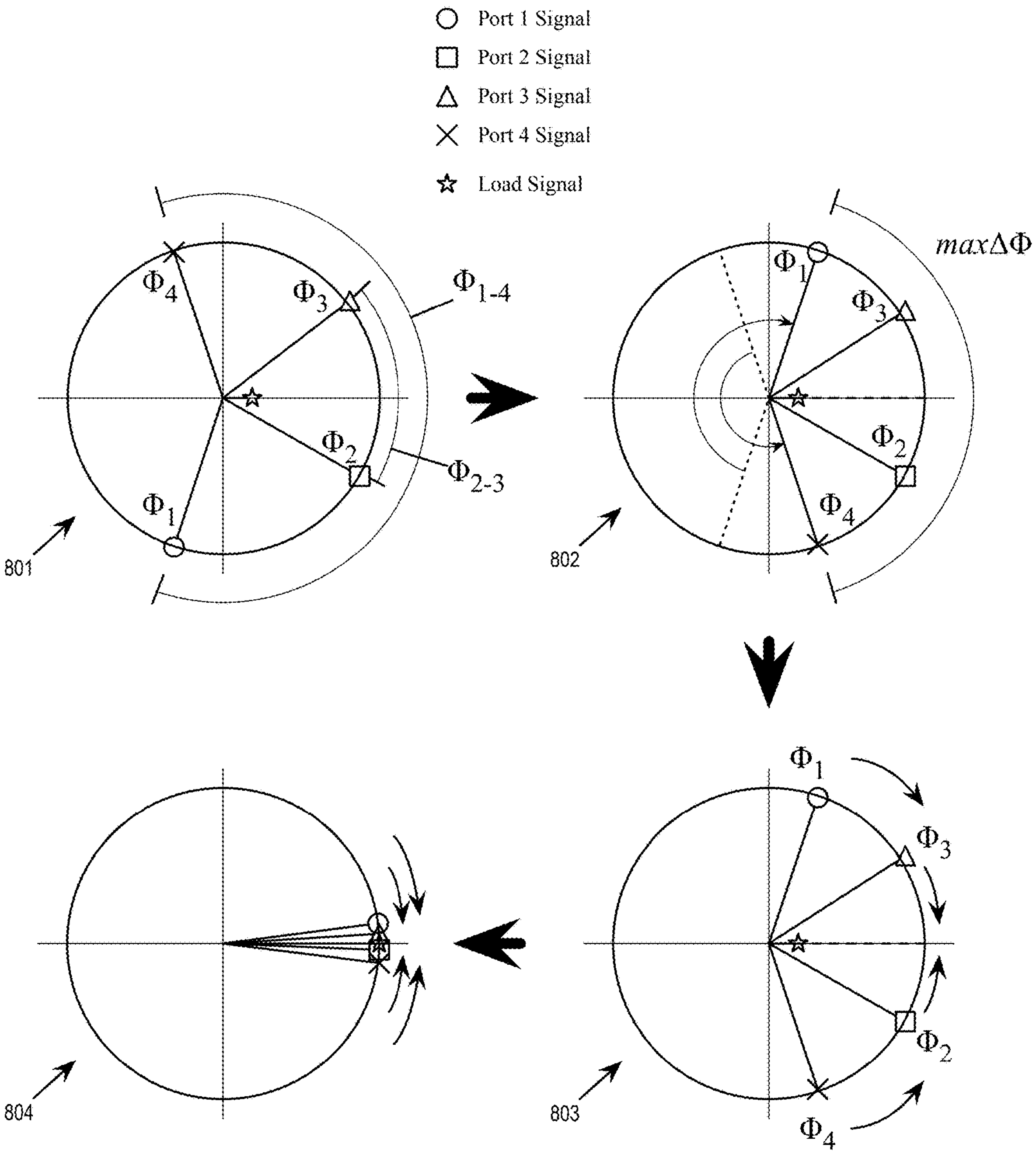
FIGS. 8A-B conceptually illustrate operations of BIT algorithm in a shunt-connected BIPS beamformer.
Figure 8B:
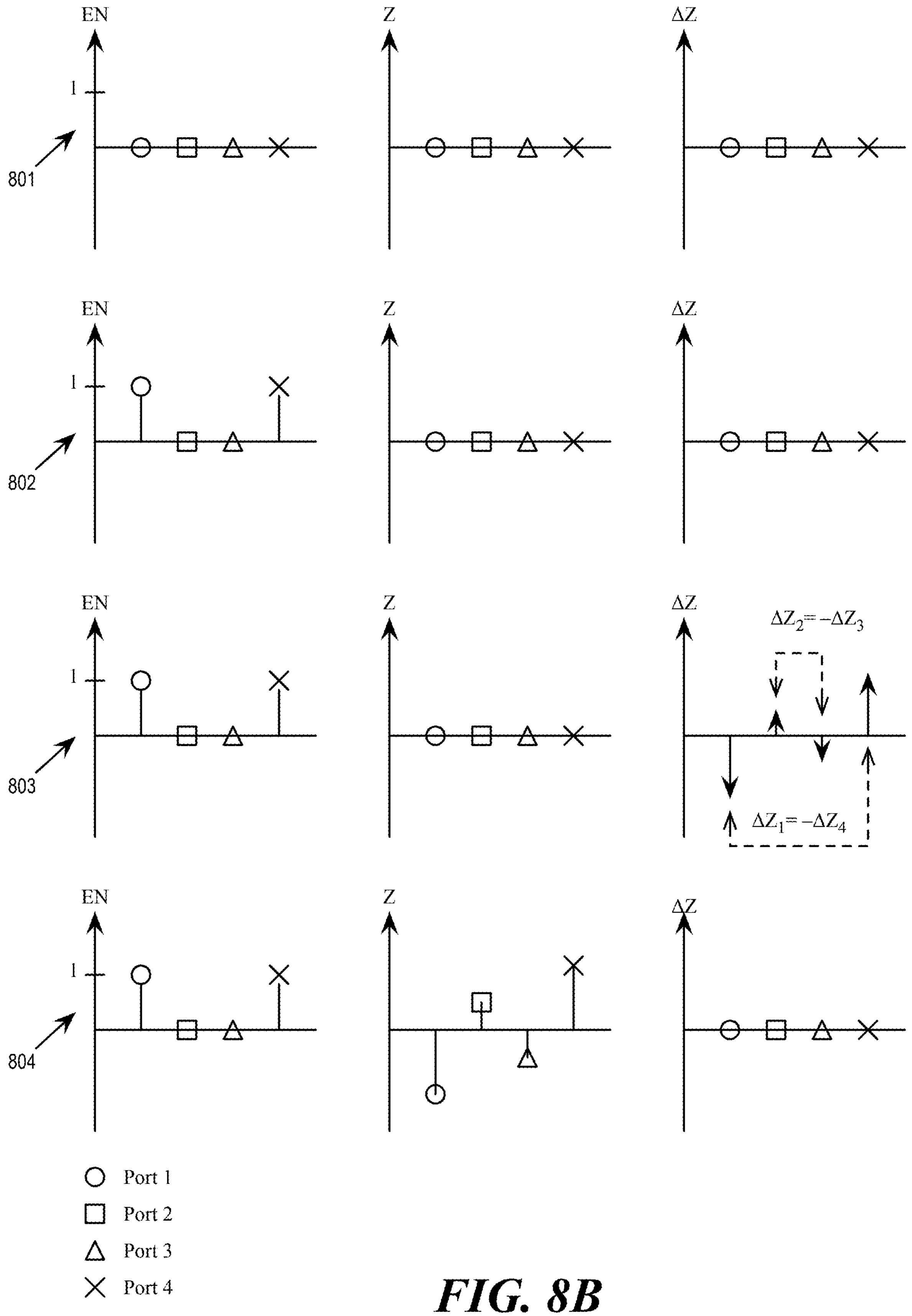

FIGS. 8A-B conceptually illustrate operations of shunt-based BIT algorithm in a shunt-connected BIPS beamformer. FIG. 8A illustrates signal phasers ($\Phi_1$ through $\Phi_4$) of the four ports 711-714 of the BIPS beamformer 700. FIG. 8B illustrates the switch enable signals (EN), the impedances (Z), and the changes in impedances (ΔZ) across the four corresponding phase shifters 721-724. The figures show the operations of the BIT algorithm in four stages 801-804. (Z of stage i=Z of stage i−1+ΔZ of stage i−1.)

At the first stage 801, the phasors of the four ports are at some initial position dependent on the angle of arrival, the impedance values (Z) for the DTZs are set to zero, and the change in impedances (ΔZ) of the four ports is zero by definition. The switch enable signals are also at zero (EN=0).

At the second stage 802, a subset of the crossover switches 741-744 of the BIPS unit cells are enabled (EN=1 for ports 1 and 4) to introduce a 180° relative phase shift on the associated ports to reduce the maximum phase shift between the port signals (max ΔΦ).

At the third stage 803, the changes in impedances of ports 1 and 4 are made to be a symmetrical pair, and the changes in impedances of ports 2 and 3 are made to be a symmetrical pair. That is $\Delta Z_1=-\Delta Z_4$ and $\Delta Z_2=-\Delta Z_3$.

At the fourth stage 804, the phasors of ports are adjusted using the relationships from stage two and three to reduce the phase difference between the ports further, i.e., fine phase shifting. The corresponding changes in impedances of ports 2 and 3 are provided by configuring the DTZs 732 and 733 of ports 2 and 3. The corresponding changes in impedances of ports 1 and 4 are provided by configuring the DTZs 731 and 734 of ports 1 and 4. After the fourth stage 804, the phases of the four ports have converged to nearly the same phase and the signal to the load is maximized, i.e., the beamformer has achieved low-loss beamforming and good power transfer to the load signal.

The phasors may not converge to exactly the same phase to achieve maximum power delivery to the load. The effective port impedance seen at the summing node increases with larger Z values, i.e., larger phase shifts, and this introduces some impedance mismatch or reflected power. Therefore, it is sometimes preferable to accept some small misalignment in phase rather than a larger mismatch in impedances at the summing node. In the fourth stage 804 of the shunt-based BIT algorithm, the shunt-connected beamformer may seek to maximize the power transfer to the load but not necessarily perfectly align all phasors.

This procedure shown in FIGS. 8A-B may be performed for different angles of arrivals. For example, in some cases, none of the crossover switches need to be enabled as the maximum phase shift between the ports is already at a minimum. In some other cases, the crossover switches enabled will be different from the example shown in FIGS. 8A-B. The required impedances and crossover switch enables needed to maximize the power delivered to the load will vary depending on the angle of arrival.

In some embodiments, there may be non-uniform or unbalanced delays on the ports in addition to the delays due to the angle of arrival (AoA or θ). This may be a result of unequal routing lengths from the ports to the summing node, or some other reason. This will cause the phase centers of the outer ports ($\Phi_1$ and $\Phi_4$) not being equal to the phase centers of the inner ports ($\Phi_2$ and $\Phi_3$).

Figure 9A:
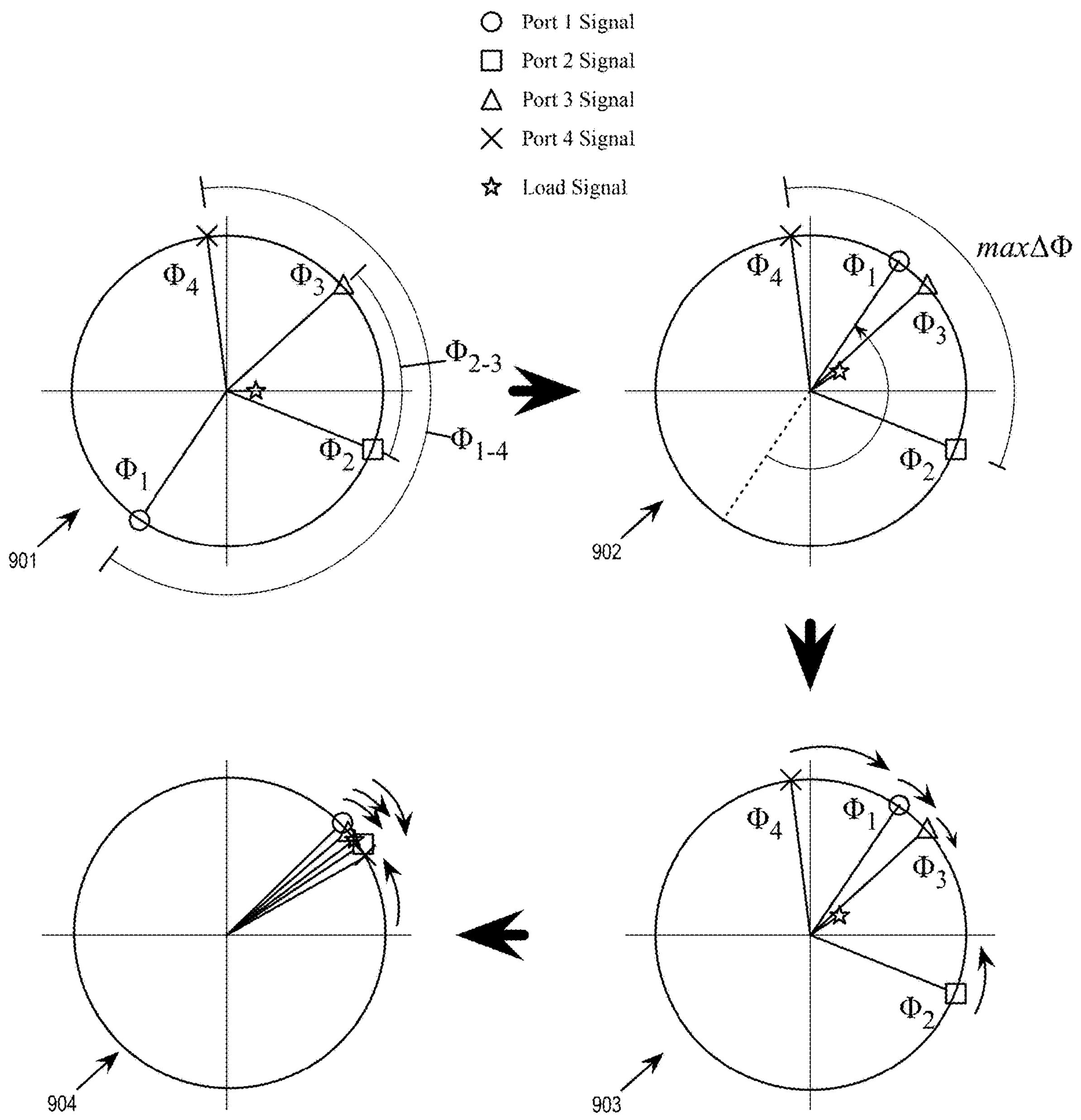
FIGS. 9A-B conceptually illustrate operations of shunt-based BIT algorithm in a shunt-connected BIPS beamformer when there is unbalanced delay across the ports.
Figure 9B:
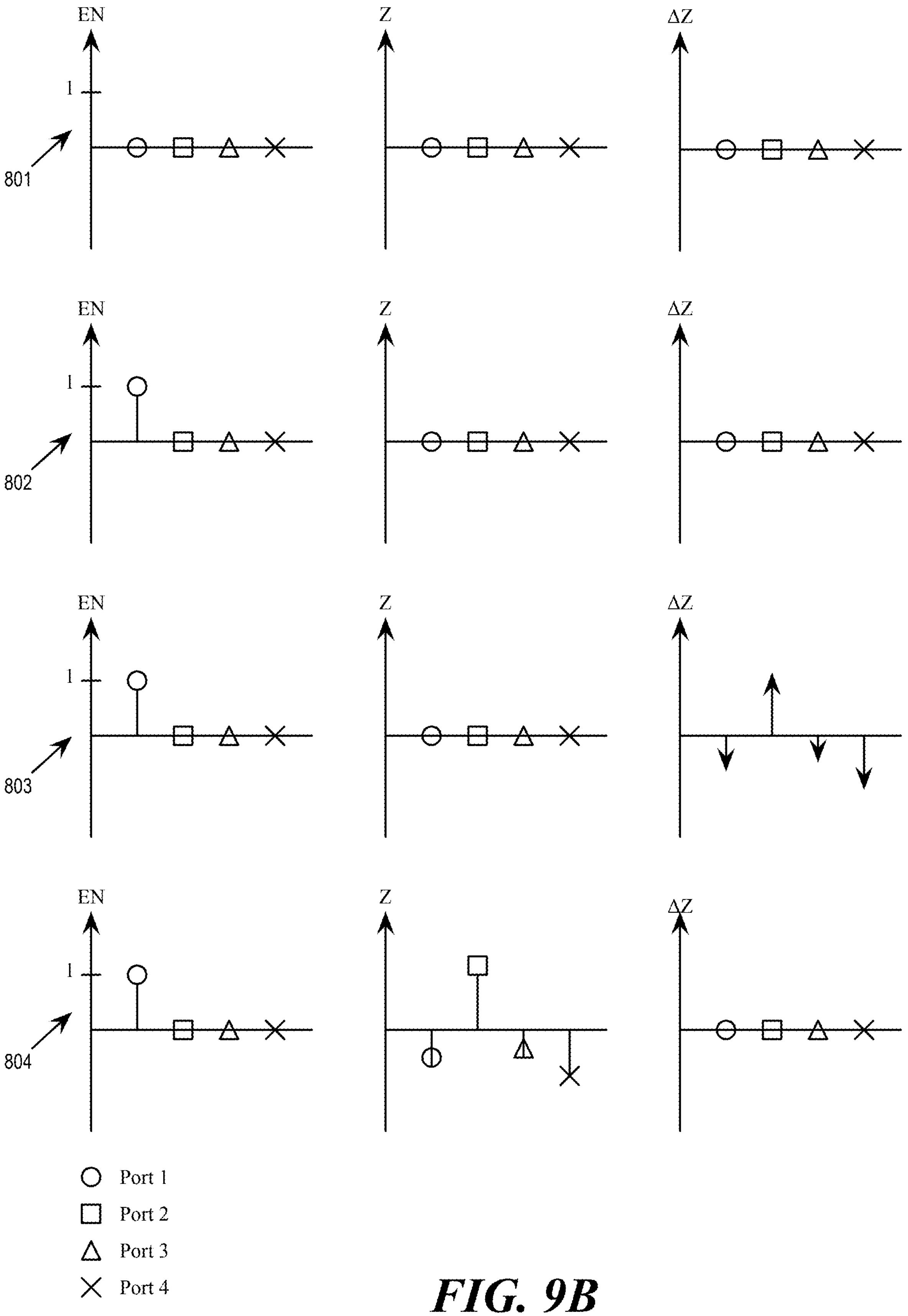

FIGS. 9A-B conceptually illustrate operations of shunt-based BIT algorithm in a shunt-connected BIPS beamformer when there is unbalanced delay across the ports. FIG. 9A illustrates signal phasers ($\Phi_1$ through $\Phi_4$) of the four ports 711-714 of the BIPS beamformer 700. FIG. 9B illustrates the switch enable signals (EN), the impedances (Z), and the changes in impedances (ΔZ) across the four corresponding phase shifters 721-724.

As illustrated, at the first stage 901, the phasors of the four ports are at some initial position dependent on the angle of arrival, the impedance values (Z) for the DTZs are set to zero, and the change in impedances (ΔZ) of the four ports is zero by definition. The switch enable signals are also at zero (EN=0). However, unlike the example of FIGS. 8A, the phase center between ports 1 and 4 ($\Phi_{1-4}$) and the phase center between ports 2 and 3 ($\Phi_{2-3}$) are not the same. This is indicative of unbalanced delays on all ports. Phase center between i and j, or $\Phi_{i-j}$, is defined as $(\Phi_i-\Phi_j)/2$.

At the second stage 902, a subset of the crossover switches 741-744 of the BIPS unit cells are enabled to introduce a 180° relative phase shift on the associated ports to reduce the maximum phase shift between the port signals. In this example, the crossover switch 741 is enabled (EN=1 for port 1) to introduce a 180° relative phase shift on port 1 for coarse phase shifting. This is used to reduce maximum delta phase shift. (To reduce max $\Delta\Phi$, or max($\Phi_i-\Phi_j$), for all i and all j). It is worth noting that, in this unbalanced delay example, the crossover switch(es) may not be enabled in pairs as in the balanced delay case.

At the third stage 903, the changes in impedances $\Delta Z$ are made for all four ports. The shunt-based BIT algorithm here is modified so that balanced tuning is defined to be such that $Z_1+Z_2+Z_3+Z_4$ approximately equal to 0 or some other fixed value. This constrains impedance mismatch losses but also allows the algorithm to tune the phasor alignment.

The fourth stage 904 proceeds the same in the balanced delay case (i.e., same as the stage 804 of FIGS. 8A-B). Namely, the impedances are programmed for fine phase shifting using the constraint from the third stage. This allows for the algorithm to compensate for the additional delays in the system.

In some embodiments, the shunt-based BIT algorithm may be used to minimize the power delivered to the load from an interferer, i.e., interference rejection, instead of maximizing load signal power. In this case, the algorithms will still follow the four-stage process but for stage 1 a subset of the crossover switches 741-744 of the BIPS unit cells are enabled to introduce a 180° relative phase shift on the associated ports to increase the maximum phase shift between the port signals. This acts as coarse phase shifting. Also, for stage 4 the phasors of ports are adjusted using the relationships from stage two and three to maximize the phase difference between the ports further and minimize the interferer power at the load, fine phase shifting.

In some other embodiments, the algorithm may seek to optimize a weighted objective comprising maximizing signal power and minimizing interference power, where the signal and interferer are spatially separated. For such situations, the algorithms described above can be used and the effect at each stage assessed on the weighted objective.

For some embodiments, there may be a limit to the absolute range of achievable impedances in the BIPS DTZ circuits, and there are quantization steps of finite sizes within this range. The shunt-based BIT algorithm may take these practical limitations into consideration. The algorithm may select the most optimal Z and EN values for a given objective angle of arrival.

The separation of steps one through four of the shut-based BIT algorithm described above is primarily for clarity. The determination of the values (e.g., Z and EN) used may in the BIT algorithm may be found using Kirchhoff's circuit equations, simulations sweeps and optimizer searches, experimental sweeps, experimental measurement, or some combination of these techniques with or without the balanced impedance constraints. Once the final value is determined, the order of the steps in the algorithm may be altered.

The shunt-connected BIPS beamformer realizes a low loss, low complexity beamformer similar to the series-connected BIPS beamformer. Additionally, it has two advantages over the series-connected BIPS beamformer and traditional RF beamforming circuits:

First, because the beamforming ports are connected in shunt, the shunt-connected BIPS beamformer presents a low impedance at the input/output port (e.g., Port 5 in FIG. 7). This impedance is nominally $R_S/M$, where $R_S$ is the beamforming port impedance and M is the number of beamforming ports connected in shunt, which is M-times lower than the impedance presented by traditional beamforming circuits (without BIPS) and $M^2$ times lower than the impedance presented by series-connected BIPS beamformer. The lower impedance allows the shunt-connected beamformer to support (at port 5) a higher power output power amplifier (PA) for a given supply voltage, or a higher linearity receiver design (e.g., low-noise amplifiers, or LNAs).

Second, because the beamforming ports are connected in shunt, the circuit shows less loss as a function of parasitic common mode impedances. The losses due to parasitic common mode impedances are a major source of loss for the series-connected BIPS beamformer and they scale more than linearly with the number of beamforming ports connected in series. Significant design area, in the form of matching networks and TLTs, is required to generate large common mode impedances at the summing node to mitigate these common mode losses. This is much less of an issue in a shunt-connected BIPS beamformer. For differential excitation from the beamforming ports of a shunt-connected BIPS beamformer, there is very little to no loss through the common mode port impedances.

Figure 10:
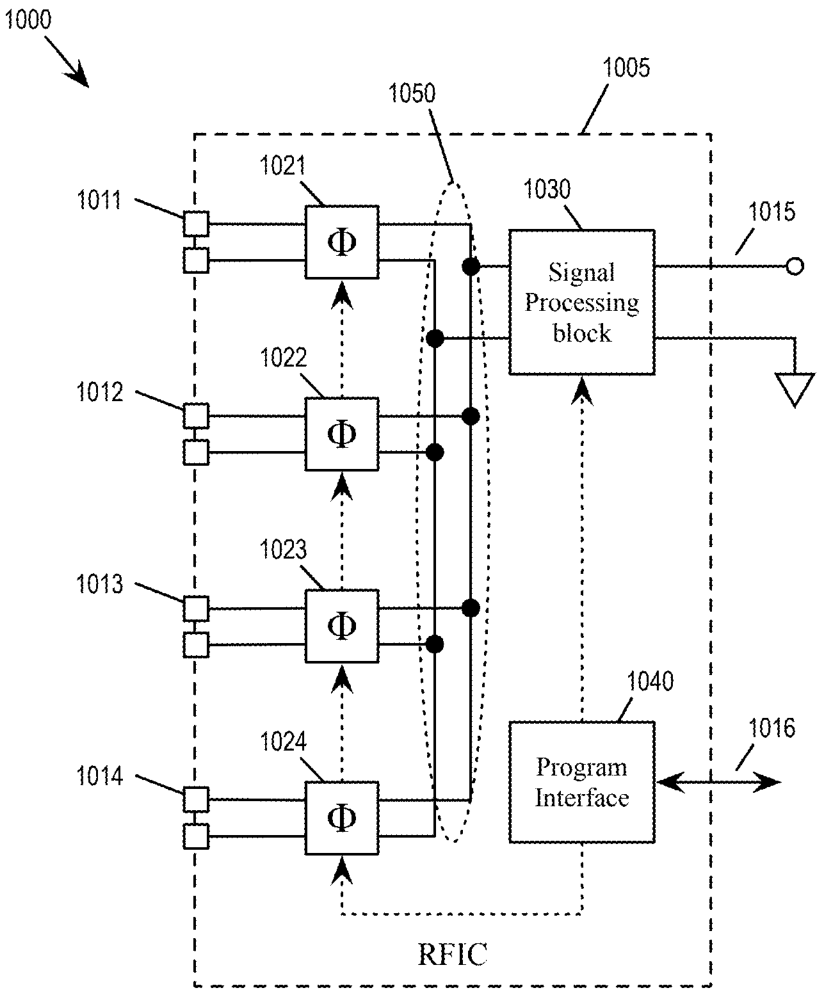
FIG. 10 conceptually illustrates a shunt-connected BIPS beamformer that is implemented in an RFIC.

The shunt-connected BIPS beamformer may be implemented in a radio frequency integrated circuit (RFIC) or printed circuit board (PCB). FIG. 10 conceptually illustrates a shunt-connected BIPS beamformer 1000 that is implemented in an RFIC 1005. The RFIC 1005 implements four beamforming ports 1011-1014 and four corresponding phase shifters 1021-1024 connected in shunt at a summing node 1050. The RFIC 1005 also includes a signal process block 1030 that receives or transmits the signal to or from the summing node 1050. The RFIC 1005 also includes a programming interface 1040, which provides data paths that allow the phase shifters 1021-1024 and the signal processing block 1030 to be configured. The phase shifters 1021-1024 can be configured to control the beamforming angle. The signal processing block 1030 can be configured to condition the signal in or out of a fifth port 1015 (Port 5). In some embodiments, the signal processing block 1030 can be a LNA, a PA, a transformer, a short, etc.

In some embodiments, the shunt-connected BIPS beamformer may further include additional circuit elements.

Figure 11:
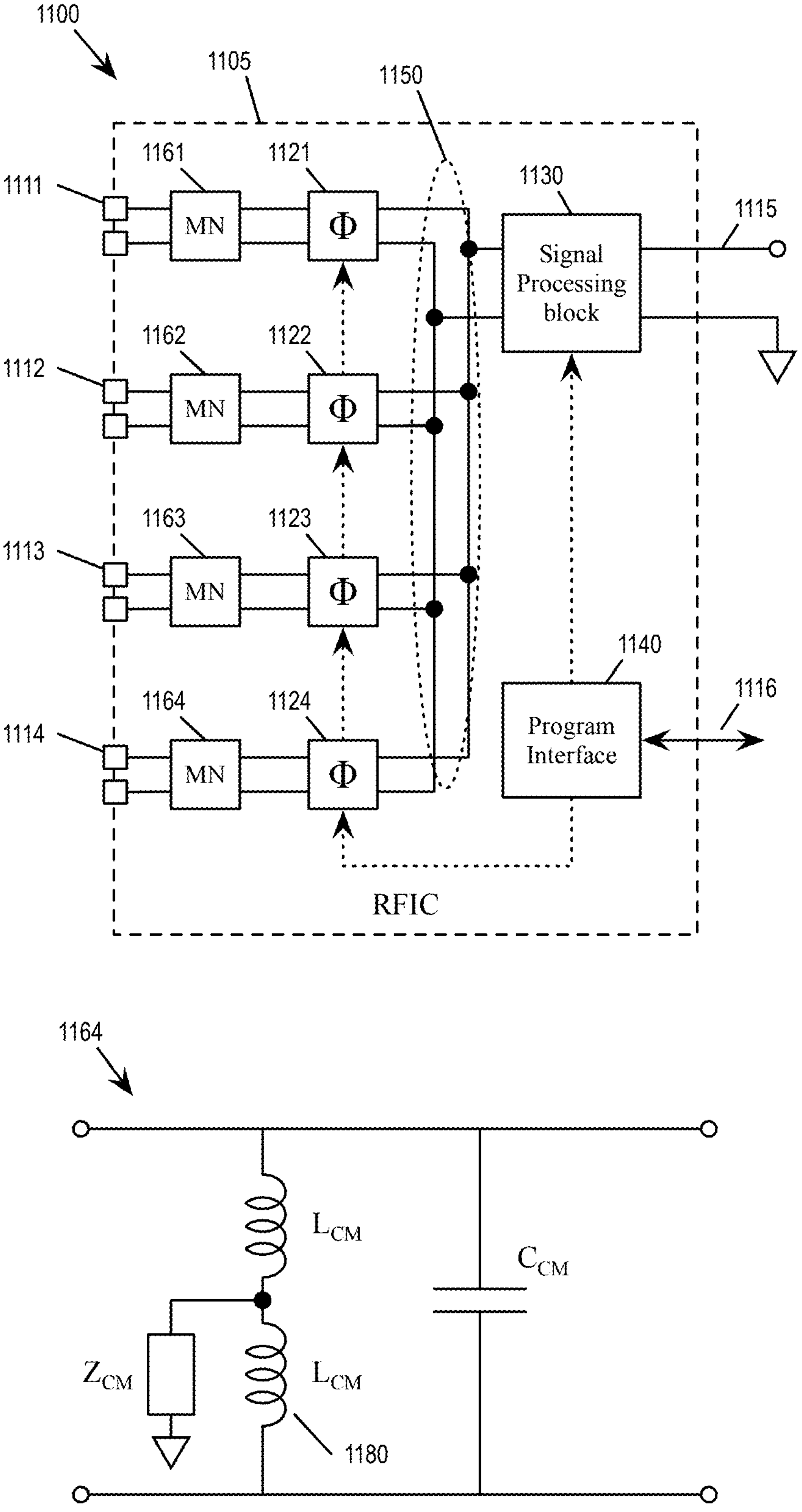
FIG. 11 illustrates a shunt-connected BIPS beamformer having matching networks at its beamforming ports.

(1) Matching Networks:

Even though the shunt-connected BIPS beamformer is much more resilient to common-mode losses it can be beneficial to provide a high common-mode impedance at the summing node (i.e., a shunt connection point). This can be achieved by adding a matching network. FIG. 11 illustrates a shunt-connected BIPS beamformer 1100 having matching networks at its beamforming ports. The BIPS beamformer 1100 includes four beamforming ports 1111-1114 and four corresponding phase shifters 1121-1124 connected in shunt at a summing node 1150. The beamformer 1100 also includes a signal process block 1130 that processes differential signal at the summing node 1150. The beamformer 1100 also includes a programming interface 1140, which provides data paths that allow the phase shifters 1121-1124 and the signal processing block 1130 to be configured. The phase shifters 1121-1124 can be configured to control the beamforming angle. The signal processing block 1130 can be configured to condition the signal in or out of a fifth port 1115 (Port 5).

The BIPS beamformer 1100 is similar to the BIPS beamformer 1000 and can be implemented in a RFIC 1105. However, the BIPS beamformer also includes additional matching networks (MNs) 1161-1164. Each matching network (e.g., MN 1164) may include one or more capacitive and/or inductive elements (e.g., common-mode inductor $L_{CM}$, common mode capacitor CCM, common-mode impedance $Z_{CM}$) for providing the necessary impedance.

The matching networks 1161-1164 are used to condition the common mode impedance at the summing node 1150 from the beamforming ports to some large real value to further reduce common losses. Each matching network may also be used to condition the differential port impedance at the beamforming ports 1111-1114 to 50Ω or some other desired value. Such a network may also provide electrostatic discharge (ESD) protection, e.g., via a shunt inductor (such as $L_{CM}$ 1180) or DC blocking, e.g. via AC coupling capacitors.

Figure 12A:
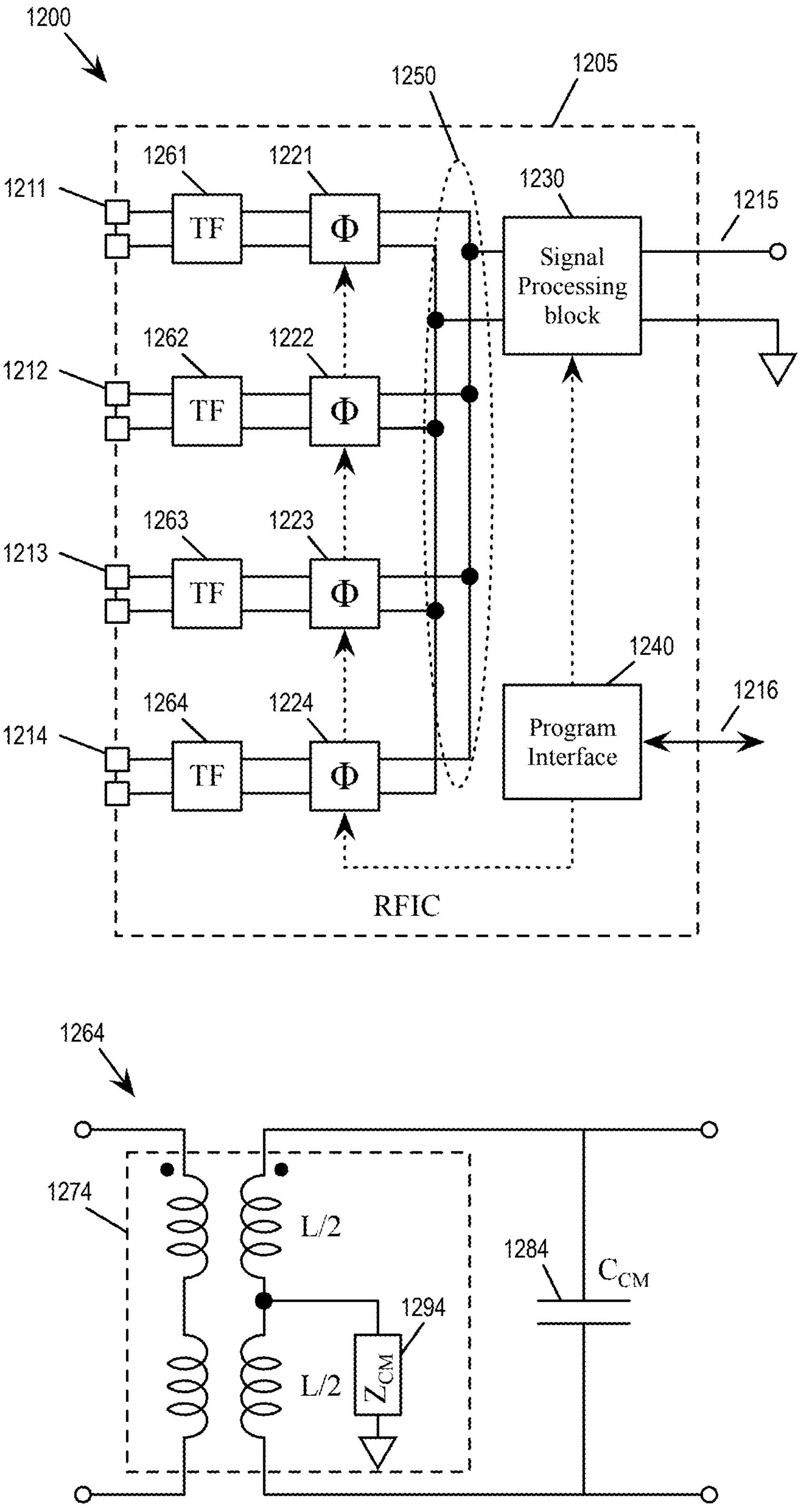
FIGS. 12A-B illustrate a shunt-connected BIPS beamformer having transformer-based matching networks at its beamforming ports.
Figure 12B:
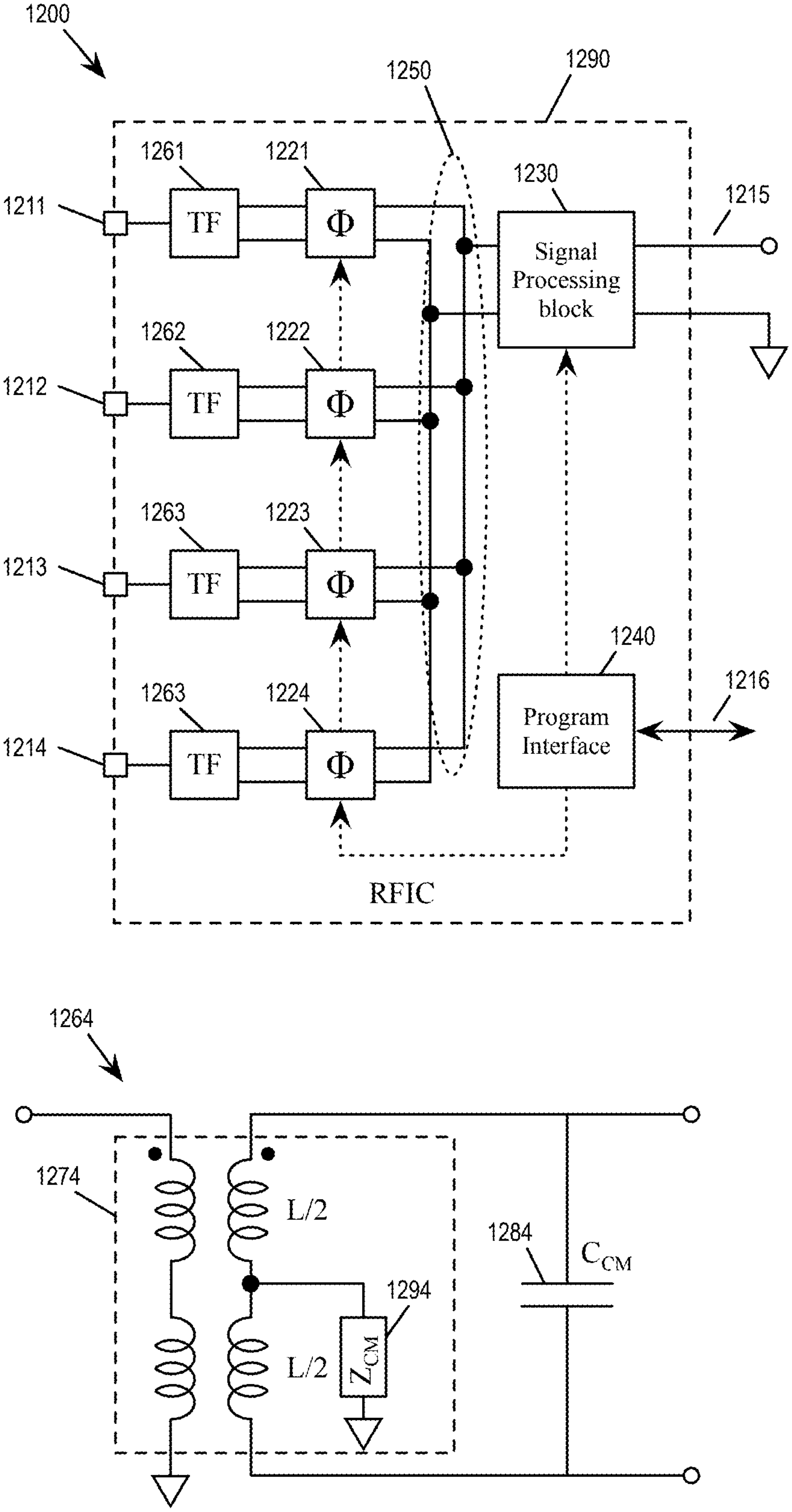

(2) Transformer-Based Matching Networks:

FIGS. 12A-B illustrate a shunt-connected BIPS beamformer 1200 having transformer-based matching networks at its beamforming ports. The BIPS beamformer 1200 includes four beamforming ports 1211-1214 and four corresponding phase shifters 1221-1224 connected in shunt at a summing node 1250. The beamformer 1200 also includes a signal process block 1230 that processes signals at the summing node 1250. The beamformer 1100 also includes a programming interface 1240, which provides data paths that allow the phase shifters 1221-1224 and the signal processing block 1230 to be configured. The phase shifters 1221-1224 can be configured to control the beamforming angle. The signal processing block 1230 can be configured to condition the signal in or out of a fifth port 1215 (Port 5).

Like the BIPS beamformer 1100, the BIPS beamformer 1200 also includes additional matching networks 1261-1264 at its four beamforming ports 1211-1214. However, these matching networks are transformer-based (therefore labeled "TF" instead of "MN" in the figure.) Each transformer-based matching network (e.g., TF 1264) may include an isolation transformer (or a balun unit) 1274 and a common-mode capacitor 1284 ($C_{CM}$). The isolation transformer 1274 may also include an additional common impedance 1294 ($Z_{CM}$) that is used to resonate out parasitic common mode impedance. However, since the transformer 1274 provides a high common-mode impedance naturally, $Z_{CM}$ may not be needed for all implementations. The transformer-based MNs also resets the common-mode impedance seen at the summing node 1250 (shunt-connection point, or port 5) to a set value independent of what is connected at the beamforming ports 1221-1224.

The isolation transformer 1274 allows circuitry at the antenna side to interface with the circuitry at the summing node side without disturbing the impedance arrangement of either side. This allows the common-mode impedance at the summing node to remain low and to be independent of the load at the beamforming ports which helps to minimize common-mode losses. The isolation transformer also provides single-ended to differential conversion between the antenna side and the summing node side.

The beamformer 1200 of FIG. 12A has differential beamforming ports. FIG. 12B illustrates the beamformer 1200 in a single-ended setting, in which the isolation transformer (e.g., 1274) in each transformer-based MN provide single-ended to differential conversion between single-ended beamforming ports 1211-1214 to differential phase shifters 1221-1224.

Figure 13:
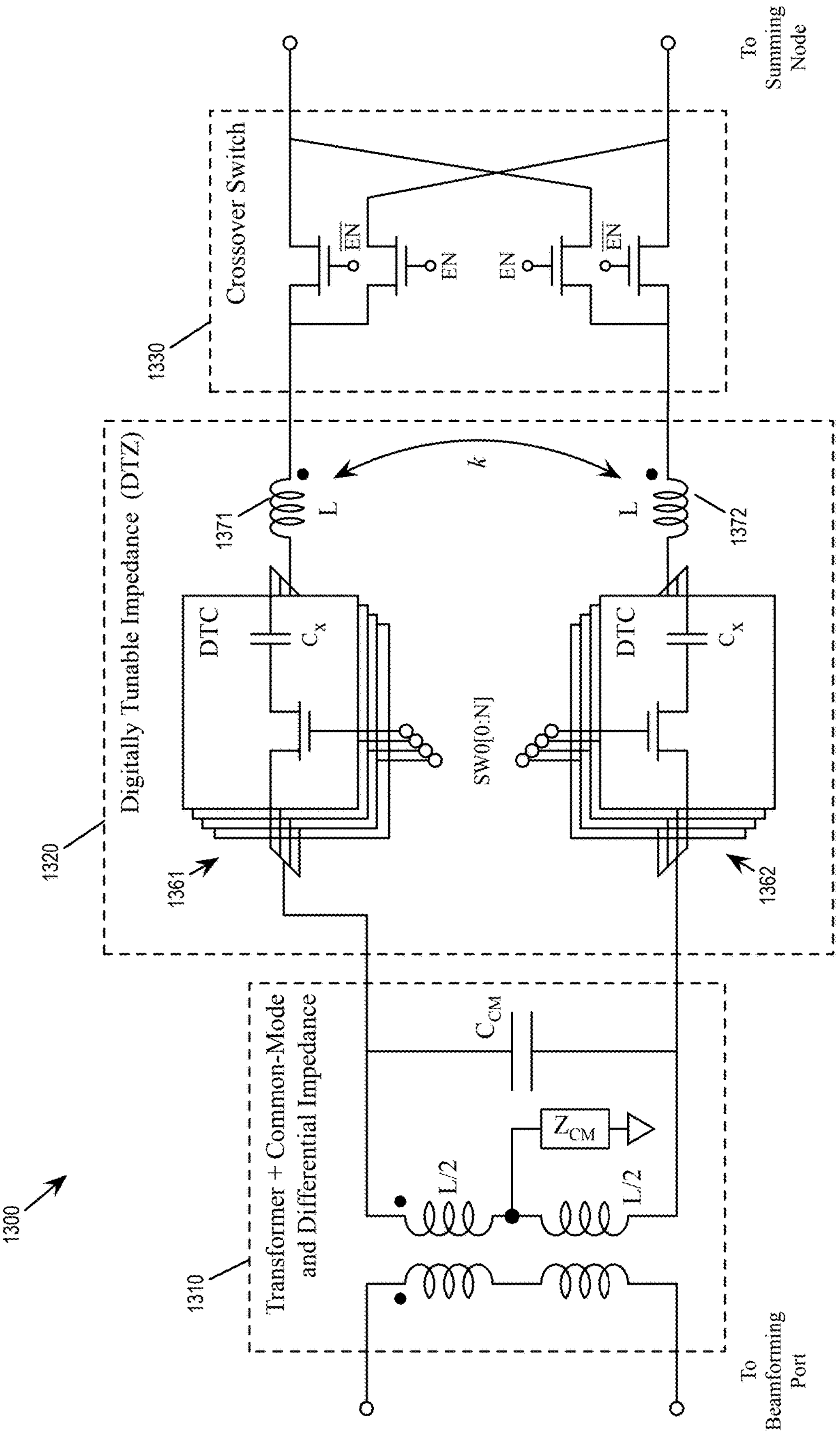
FIG. 13 conceptually illustrates a BIPS unit cell using coupled inductors in the digital tunable impedance (DTZ).

(3) Couped Inductors in the DTZs:

A BIPS unit-cell of a shunt-connected BIPS beamforming port may implement the digital tunable impedance elements (DTZs) using coupled inductors. FIG. 13 conceptually illustrates a BIPS unit cell using coupled inductors in the DTZ. The phase shifter (BIPS unit cell) 1300 includes a transformer-based matching network 1310, a digital tunable impedance (DTZ) 1320, and a crossover switch 1330. The transformer-based matching network 1310 is similar to the transformer-based matching network 1264, which includes an isolation transformer, a common-mode capacitor ($C_{CM}$), and a common-mode impedance ($Z_{CM}$). The DTZ 1320 is a subcircuit that is similar to the DTZ 731, which includes two complementary banks of DTCs 1361 and 1362 that can be configured to present a specific impedance value. The crossover switch 1330 is similar to the crossover switch 741 and is used to provide 180° phase shift in impedance. Two fixed inductors 1371 and 1372 connect the two banks of DTCs to the differential inputs of the crossover switch 1330. The two inductors 1371 and 1372 are magnetically coupled, which effectively reduces the required size and losses of the inductors since the mutual inductance under differential excitation gets boosted by a factor of k (k is the coupling co-efficient ranging from 0 to 1.) The optimal k value may vary from one implementation to another (e.g., bulk CMOS, RFSOI, PCB, etc.) depending on factors such as trace resistance, substrates losses, minimum feature size, and others.

Though FIG. 13 illustrates the BIPS cell unit 1300 as having the programmable impedance 1320 (including the DTC banks 1361 and 1362) and the crossover switch 1330 on the summing node side of the transformer-based matching network 1310 (rather than on the beamforming port side), in some embodiments, the programmable impedance 1320 and/or the crossover switch 1330 may be on either side of the transformer-based matching network 1310 in the BIPS unit cell unit 1300. For example, the DTZ 1320 may on the summing node side of the transformer-based matching network 1310, while the crossover switch 1330 may be on the beamforming port side of the transformer-based matching network 1310.

Figure 14:
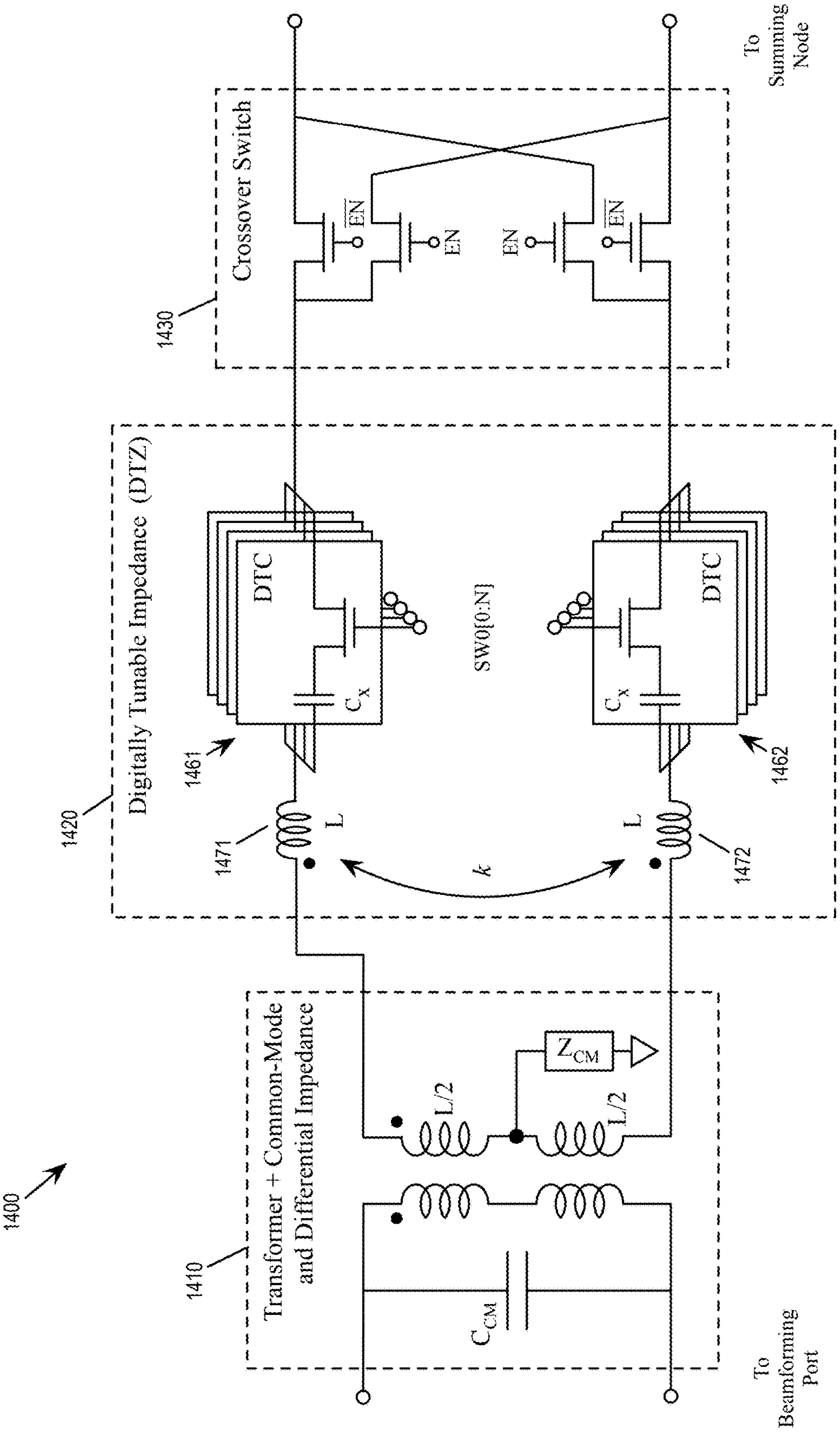
FIG. 14 illustrates a BIPS unit cell with a DTZ sub-circuit that is in a mirrored configuration.

(4) Mirrored DTZ Sub-Circuit:

The DTZ sub-circuit of the BIPS unit cell can be rearranged in a mirrored manner without affecting functionality. FIG. 14 illustrates a BIPS unit cell 1400 with a DTZ sub-circuit that is in a mirrored configuration. The phase shifter (BIPS unit cell) includes a transformer-based matching network 1410, a digital tunable impedance (DTZ) 1420, and a crossover switch 1430. The transformer-based matching network 1410 and the crossover switch 1430 are identical to their counter parts in the BIPS unit cell 1300 (the transformer-based matching network 1310 and the crossover switch 1330). The DTZ 1420 is in a mirrored configuration of the DTZ 1320 of the BIPS unit cell 1300 of FIG. 13. Specifically, the DTZ 1420 has coupled inductors 1471 and 1472 that connect two DTC banks 1461 and 1462 with the matching network 1410 rather than with the crossover switch 1430. The mirrored configuration allows for the natural grouping of passive circuit elements (e.g., inductors, capacitors, transformers) and switch devices (e.g., transistors). This minimizes transitions from passive layers to device layers and allows further circuit optimizations.

(5) Combined Programmable Capacitors and Crossover Switch:

The BIPS unit-cell may be improved by combining the switches for the programmable capacitors and crossover into a single device. Such a BIPS unit cell may include a duplicate pair of digitally tunable capacitors (DTCs) as part of the DTZ connected to the opposite polarity of the summing node. By using control signal of individual DTC switches (SW0[0:N]) with input from the crossover enable signal (EN), the impedance of the DTZ can be configured to implement either a 0° or 180° phase shift by enabling or disabling crossover.

Figure 15:
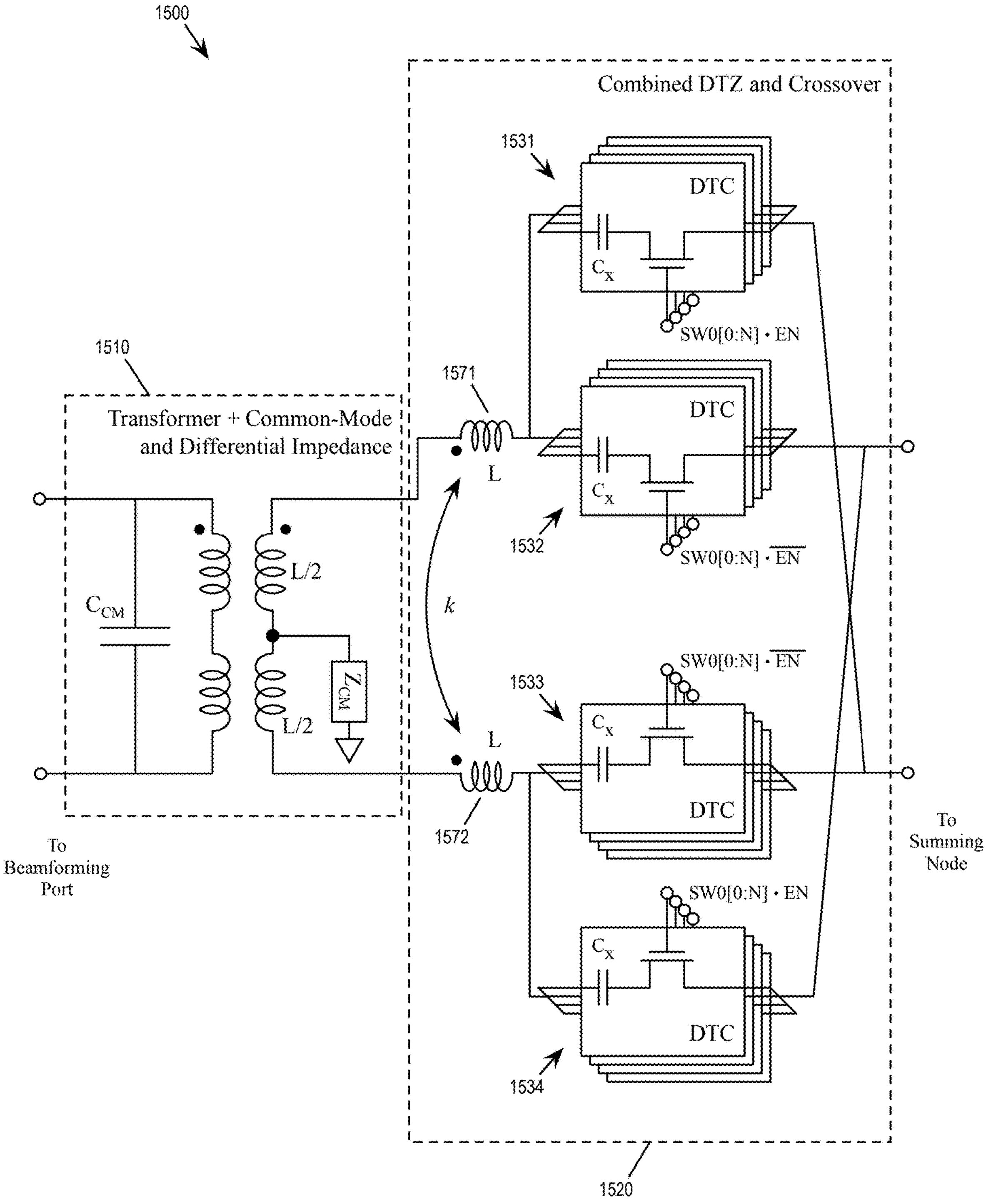
FIG. 15 conceptually illustrates a BIPS unit cell with a combined programmable capacitors and crossover switch.

FIG. 15 conceptually illustrates a BIPS unit cell 1500 with a combined programmable capacitors and crossover switch. As illustrated, the BIPS unit cell 1500 includes a transformer-based matching network 1510 and a combined DTZ and crossover switch 1520. The transformer-based matching network 1510 is identical to the transformer-based matching networks 1410 and 1310. The combined DTZ and crossover switch 1520 includes four banks of DTCs 1531-1534. The DTC banks 1531 and 1532 share one fixed inductor 1571 and the DTC banks 1533 and 1534 share one fixed inductor 1572. The fixed inductors 1571 and 1572 may form one coupled transformer.

The individual DTCs are controlled by SW0[0:N] signals together with the crossover enable signal. When the crossover enable signal (EN) is off to disable crossover (0° phase shift), the DTC banks 1532 and 1533 are enabled to differentially connect to the summing node. When the crossover enable signal is on to enable crossover (180° phase shift in impedance), the DTC banks 1531 and 1534 are enabled to differentially connect to the summing node. By dual-purposing the switches in the DTZs to also perform crossover functionality, the number of series switches is reduced from 2 to 1 and therefore potentially halve the associated resistive insertion losses.

Figure 16:
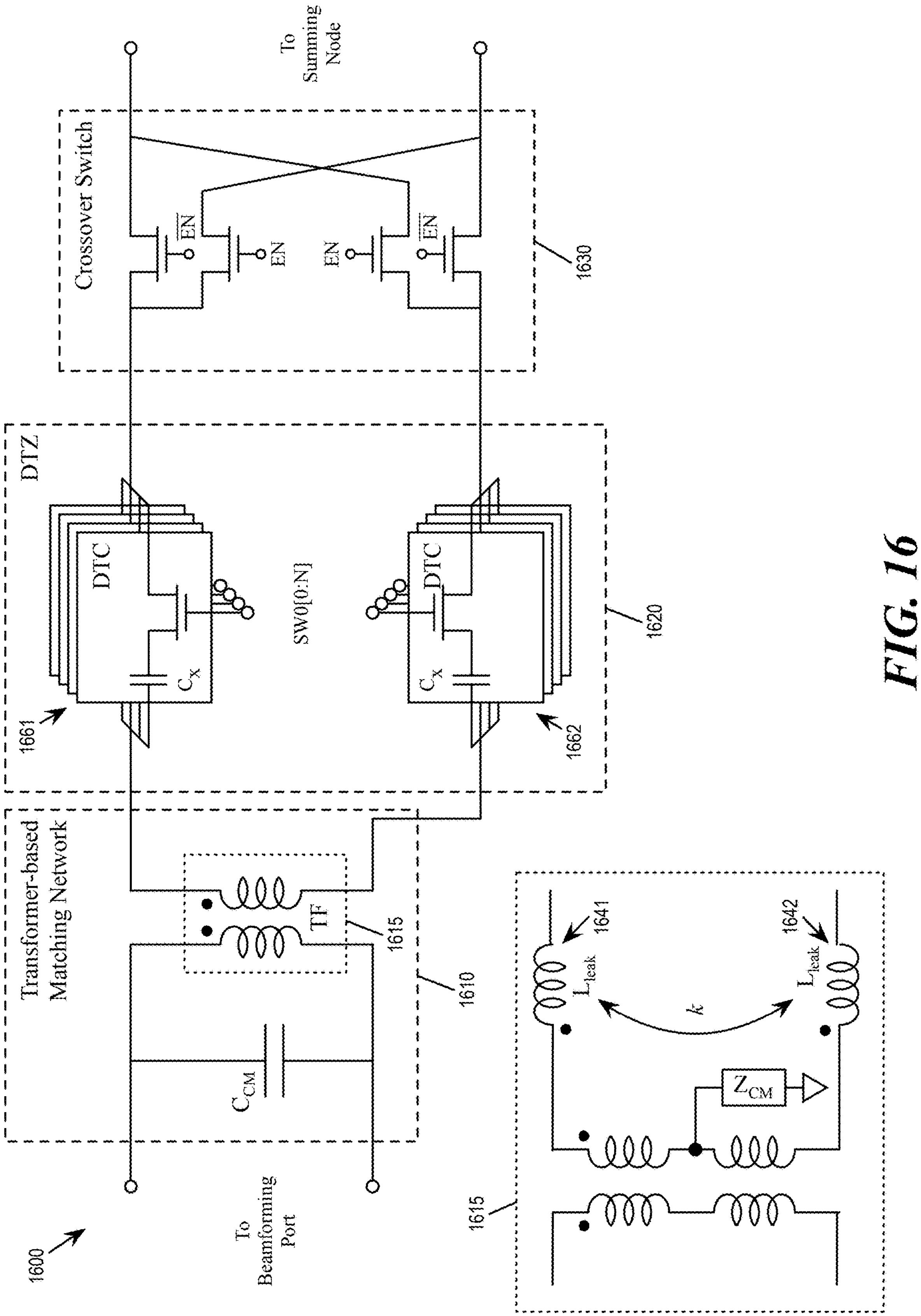
FIG. 16 illustrates a BIPS unit cell that uses transformer leakage inductance as part of a fixed inductance in the DTZ.

(6) Transformer Leakage Inductance:

The BIPS unit-cell may be improved by combining the fixed series inductors in the DTZ with the transformer-based matching network. FIG. 16 illustrates a BIPS unit cell 1600 that uses transformer leakage inductance as part of a fixed inductance in the DTZ. Similar to the BIPS unit cell 1400, the BIPS unit cell 1600 includes a transformer-based matching network 1610, a DTZ 1620, and a crossover switch 1630. The crossover switch 1630 is identical to the crossover switch 1430. The DTZ 1620 is similar to the DTZ 1420 in that it also has two DTC banks 1661 and 1662. However, unlike the DTZ 1420, the DTZ 1620 does not have inductors (or has smaller inductors) for implementing the programmable impedance. Rather, the BIPS unit cell 1600 leverages the leakage inductance in the transformer-based matching network 1610 to implement the fixed inductance in the programmable impedance (DTZ).

As illustrated, the transformer-based matching network 1610 includes a differential capacitance $C_{CM}$ and an isolation transformer 1615. The isolation transformer 1615 has leakage inductances 1641 and 1642 that are in series with the DTC banks 1661 and 1662, which can be used by the DTZ 1620 as a fixed reactive element for implementing the programmable impedance. By dual-purposing the leakage inductances in the transformer 1615 (of the transformer-based matching network 1610) to also serve as part of the DTZ 1620, the fixed inductors of the DTZ (e.g., fixed inductors 1471 and 1472 of the DTZ 1420) can either be reduced in size or removed entirely. This allows the resistive insertion losses associated with the fixed inductors to also be reduced or removed from the beamforming system.

Figure 17:
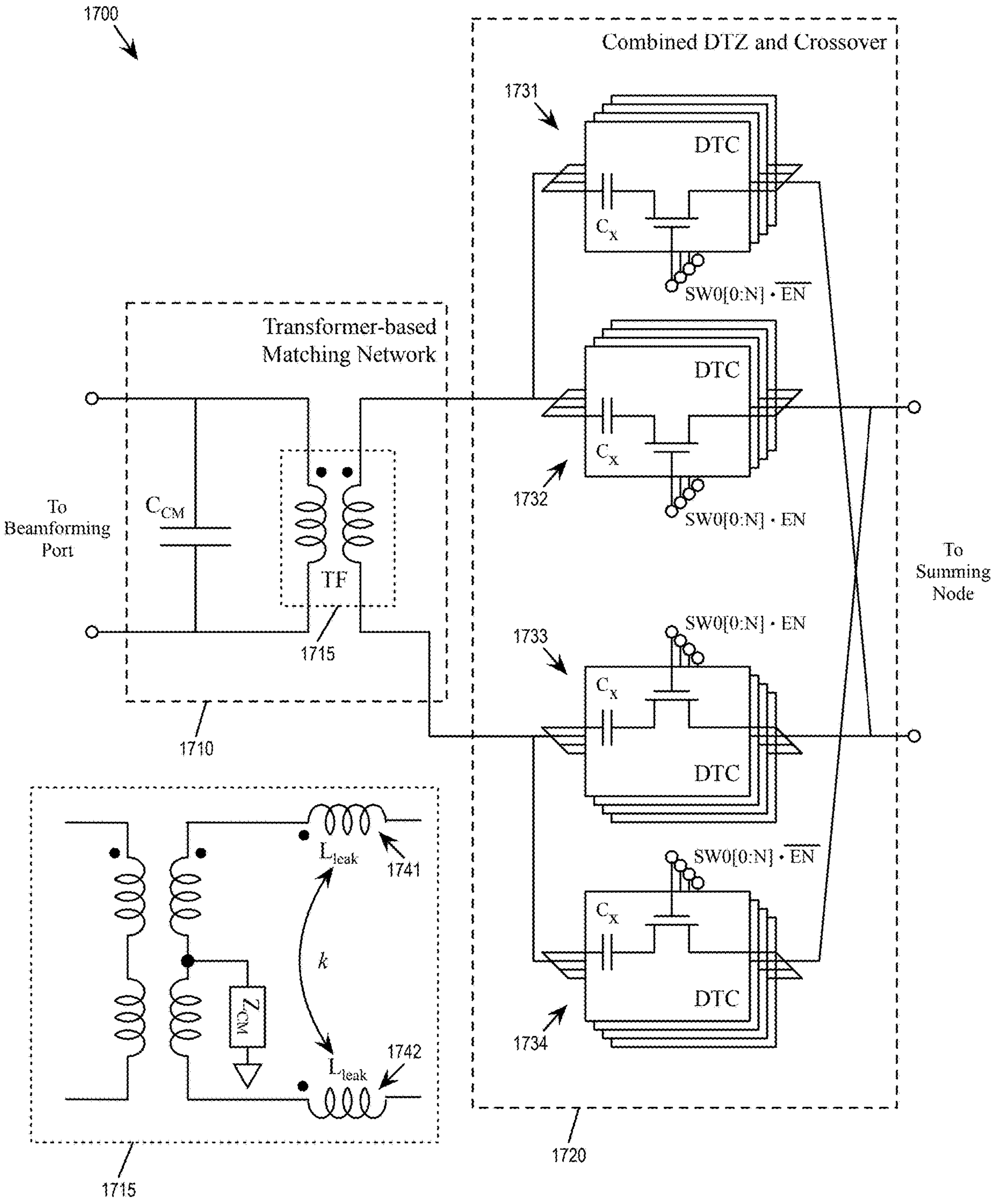
FIG. 17 shows a BIPs unit cell that incorporates all of the improvements described above.

To reduce loss, the improvements described by reference to FIGS. 11-16 above can be jointly or partly implemented in a BIPS unit cell of a shunt-connected beamformer. FIG. 17 shows a BIPs unit cell 1700 that incorporates all of the improvements described above. As illustrated, the BIPS unit cell or phase shifter 1700 includes a transformer-based matching network 1710 and a combined DTZ and crossover switch 1720. The transformer-based matching network 1710 is identical to the transformer-based matching network 1610, specifically it includes an isolation transformer 1715 that provides leakage inductances 1741 and 1742 that can be used as inductors for implementing the programmable impedance by the combined DTZ-crossover switch 1720. The combined DTZ-crossover switch 1720 is similar to the combined DTZ-crossover switch 1520 of FIG. 15, in that four different banks of DTCs 1731-1734 are controlled by SW0[0:N] signals together with the crossover enable signal EN to implement 0° or 180° phase shift and programable impedance. However, unlike the combined DTZ-crossover switch 1520, the combined DTZ-crossover switch 1720 does not have fixed inductors for implementing the programmable impedance. In some embodiments, the combined DTZ-crossover switch 1520 may include fixed inductors for implementing the programmable impedance, albeit at reduced sizes to take advantage of the leakage inductance provided by the transformer-based matching network.

The shunt-connected BIPS beamformer, as described above by reference to FIGS. 7-17, has less RF loss, which translate to higher RF performance and lower power consumption. The shunt-connected topology facilitates a high level of immunity to common-mode losses, thereby reducing sources of loss due to common mode currents. The shunt-connected BIPS beamformer may have a RF component that is multi-purposed for ESD protection, single-ended-to-differential conversion, and as the fixed reactance for BIPSs. An example of such a RF component is the isolation transformer (e.g., transformers 1274, 1615, 1715) in any of the transformer-based matching networks described above. The decreased RF component count reduces sources of RF loss. An additional matching network to provide high-impedance common-mode resistance at the summing node is not needed.

The isolation transformer provides a relatively high common-mode irrespective of what is connected to the beamforming ports. When using the TLTs in the previous works, the length and $Z^{CM}_{O}$ of the TLT had to be optimized based on the antenna's properties (or what was connected to the beamforming port). This made it difficult for commercial systems where antenna's properties (or what was connected to the beamforming port) vary widely from use case to use case. Furthermore, there is no need for external TLTs or any other specialized networks for common-mode conditioning, which means less area and less RF losses. The isolation transformer in the BIPS may be a coupled transformer, or a balun unit implemented using common topologies (e.g., alternative configurations of magnetically-coupled inductors, coupled transmission lines, etc.). An additional common mode impedance $Z_{CM}$ can be added to the isolation transformer to further optimize the impedance that the transformer presents to the summing node without significant loss.

The shunt-connected BIPS beamformer has less components and area requirements on-chip or on-board. This translates to lower complexity and lower cost. TLT and specialized matching networks are not needed since the isolation transformer handles the common-mode transformation, in addition to its many other functions. There is no need for additional ESD protection or single-ended-to-differential conversion since the transformer provides both ESD protection and single-ended-to-differential conversion.

The shunt-connected BIPS beamformer featuring the improved per-element BIPS unit cells circuit may be used in a larger phased array or beamforming system. For use in a larger phased array or beamforming system, the shunt-connected BIPS beamformer may be cascaded with other more conventional beamforming techniques, such as RF or intermediary frequency (IF) or baseband or digital or BIPS beamforming. In this way, a phased array that beamform many more ports can be realized.

The circuits of the shunt-connected BIPS beamformer may be realized on different technology nodes or PCB manufacturing techniques, e.g., silicon or other technology node, with any electrically controllable switch or transistors (e.g., Bulk, RFSOI, finFET, GAA, BiCMOS, SiGe, GaAs, GaN, MEMS, etc.). This includes realizations that are not integrated or only partially integrated into an ASIC.

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A beamforming system comprising:

a plurality of beamforming ports;

a plurality of phase shifters; and a summing node at which the plurality of phase shifters are connected in shunt, wherein each phase shifter comprises a programmable impedance controlling phase shifting at a respective beamforming port of the phase shifter, wherein the programmable impedance comprises one or more digitally tunable reactive elements.

2. The beamforming system of claim 1, wherein the plurality of phase shifters are configured to steer a beam formed by the plurality of beamforming port in one or more dimensions.

3. The beamforming system of claim 1, wherein the one or more digitally tunable reactive element is connected in series with the beamforming ports and the summing node.

4. The beamforming system of claim 1, wherein the programmable impedance comprises two complementary banks of DTCs for differential signaling.

5. The beamforming system of claim 4, further comprising inductors in series with the banks of DTCs for implementing the programmable impedance.

6. The beamforming system of claim 1, wherein each phase shifter further comprises a crossover switch for configurably introducing a 180° phase shift at the respective beamforming port.

7. The beamforming system of claim 6, further comprising a programming interface that provide control signals to control the programmable impedance and the crossover switch of each phase shifter.

8. The beamforming system of claim 6, wherein the programmable impedance and the crossover switches of the plurality of phase shifters are controlled to implement a balanced impedance tuning (BIT) algorithm.

9. The beamforming system of claim 1, wherein the programmable impedance is digitally controlled to vary from $+jkR_S$ to $-jkR_S$, where $R_S$ is the beamformer port impedance and k is a scaling factor set by the desired scan angle.

10. The beamforming system of claim 1, wherein a common mode impedance at the summing node is independent of an impedance at the respective beamforming port.

11. The beamforming system of claim 1, wherein each phase shifter further comprises a matching network that is configured to condition a common mode impedance at the summing node.

12. The beamforming system of claim 11, wherein the matching network is further configured to condition a differential port impedance at a beamforming port to a specific value.

13. The beamforming system of claim 11, wherein the matching network comprises a shunt inductor for providing electrostatic discharge (ESD) protection.

14. The beamforming system of claim 11, wherein the matching network comprises an isolation transformer or a balun unit.

15. The beamforming system of claim 14, wherein the balun unit provides single-ended to differential conversion between the respective beamforming port and the summing node.

16. The beamforming system of claim 14, wherein leakage inductance of the transformer or the balun unit is used to implement the programmable impedance.

17. The beamforming system of claim 1, wherein the programmable impedance comprises first, second, third, and fourth banks of digital tunable capacitors (DTCs) that are controlled by a crossover enable signal to configurably introduce a 180° phase shift, wherein:

when the crossover enable signal is off, the second and third banks of DTCs are enabled to differentially connect to the summing node, when the crossover enable signal is on, the first and forth banks of DTCs are enabled to differentially connect to the summing node.

18. The beamforming system of claim 1, wherein each of the plurality of beamforming ports is attached to an antenna as part of a phased array.

19. The beamforming system of claim 1, wherein the beamforming system is a first phased array that is cascaded with a second phased array to form a larger phased array.

20. An integrated circuit (IC) comprising:

a plurality of beamforming ports;

a plurality of phase shifters; and a summing node at which the plurality of phase shifters are connected in shunt, wherein each phase shifter comprises a programmable impedance controlling phase shifting at a respective beamforming port of the phase shifter wherein the programmable impedance comprises one or more digitally tunable reactive elements.

* * * * *